United States Patent
Yang et al.

(10) Patent No.: US 9,490,006 B2
(45) Date of Patent: Nov. 8, 2016

(54) TIME DIVISION MULTIPLEXED MULTIPORT MEMORY

(71) Applicant: TAIWAN SEMICONDUCTOR MANUFACTURING COMPANY LTD., Hsinchu (TW)

(72) Inventors: Xiuli Yang, Shanghai (CN); He-Zhou Wan, Shanghai (CN); Ming-En Bu, Shan Ghai (CN); Mu-Jen Huang, Taipei (TW); Ching-Wei Wu, Nantou County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/622,063

(22) Filed: Feb. 13, 2015

(65) Prior Publication Data
US 2016/0163378 A1    Jun. 9, 2016

(30) Foreign Application Priority Data
Dec. 8, 2014 (CN) .......................... 2014 1 0745293

(51) Int. Cl.
| | | |
|---|---|---|
| G11C 11/00 | (2006.01) | |
| G11C 7/00 | (2006.01) | |
| G11C 8/00 | (2006.01) | |
| G11C 11/418 | (2006.01) | |
| H04J 3/06 | (2006.01) | |
| G11C 11/419 | (2006.01) | |

(52) U.S. Cl.
CPC ............ *G11C 11/418* (2013.01); *G11C 11/419* (2013.01); *H04J 3/0644* (2013.01)

(58) Field of Classification Search
USPC ......... 365/154, 156, 189.02, 189.17, 230.02, 365/230.05, 233.1, 233.12
See application file for complete search history.

(56) References Cited

U.S. PATENT DOCUMENTS

| | | | | |
|---|---|---|---|---|
| 5,732,041 | A * | 3/1998 | Joffe .................. | G06F 13/1647 365/230.05 |
| 6,314,047 | B1 * | 11/2001 | Keay ........................ | G11C 8/16 365/230.05 |
| 6,742,088 | B1 * | 5/2004 | Wielage .................. | G11C 8/16 365/230.05 |
| 8,861,300 | B2 * | 10/2014 | Chin .................... | G11C 7/1006 365/230.05 |
| 8,902,672 | B2 * | 12/2014 | Iyer ......................... | G11C 8/16 365/230.05 |

* cited by examiner

*Primary Examiner* — Trong Phan
(74) *Attorney, Agent, or Firm* — WPAT, P.C., Intellectual Property Attorneys; Anthony King

(57) ABSTRACT

In some embodiments, a time division multiplexing (TDM) circuit is configured to receive an external clock signal and generate an internal clock signal that has at least one pulse during a clock cycle of the external clock signal. An address selector is configured to select a current address before a first time within one of the at least one pulse, and select a next address starting from the first time to generate a selected address. An address storage element is configured to receive the selected address from the address selector and provide a passed through or stored address. The provided address is the current address substantially throughout the one of the at least one pulse. A single-port (SP) memory is configured to access at least one SP memory cell at the address provided by the address storage element in response to the internal clock signal.

14 Claims, 14 Drawing Sheets

TIME DIVISION MULTIPLEXED MULTIPORT MEMORY

PRIORITY CLAIM AND CROSS-REFERENCE

This application claims priority to CN. application Ser. No. 201410745293.6 filed on 2014 Dec. 8, the disclosure of which is hereby incorporated by reference in its entirety.

BACKGROUND

Multi-port memories, such as dual-port SRAMs allow two operations, such as a read and a write, per clock cycle, thereby increasing bandwidth of the dual-port SRAMs to about 2× of single-port SRAMs. To implement a dual-port SRAM, each bit cell of the memory can have an additional port added thereto. However, transistors and wires for implementing the additional port for each bit cell occupy additional area. Furthermore, a read-disturb-write situation or a write-disturb-write situation can arise, for example, when a write operation occurs at one port, and a dummy read operation resulted from a read operation or a write operation of another cell in the same row occurs at the other port simultaneously. In contrast, a dual-port SRAM can be implemented using single-port SRAM cells with the single port shared by two operations in a time division multiplexed manner. In this way, the area efficiency is higher and the read-disturb-write and write-disturb-write situations are prevented.

BRIEF SUMMARY

In some embodiments, a circuit includes a single-port (SP) memory, a time division multiplexing (TDM) circuit, an address selector and an address storage element. The time division multiplexing (TDM) circuit is configured to receive an external clock signal and generate an internal clock signal that has at least one pulse during a clock cycle of the external clock signal. The input port selector is configured to select a current input datum before a first time within one of the at least one pulse, and select a next input datum starting from the first time to generate a selected input datum. The input port storage element is configured to receive the selected datum from the input port selector and provide a provided datum passed through or stored in the input port storage element. The provided datum is the current input datum substantially throughout the one of the at least one pulse. The single-port (SP) memory is configured to be accessed on the provided datum by the input port storage element in response to the internal clock signal.

In some embodiments, a circuit comprises a single-port (SP) memory, a time division multiplexing (TDM) control circuit, an internal clock generator, an input port selector, and an input port storage element. The time division multiplexing (TDM) control circuit is configured to receive an external clock signal and generate a current pulse control signal which asserts and deasserts in a clock cycle of the external clock signal. The internal clock generator is configured to generate an internal clock signal which has at least one pulse in the clock cycle. One of the at least one pulse is generated in response to the current pulse control signal. The input port selector is configured to select a next input datum in response to the assertion of the current pulse control signal and select a current input datum prior to selecting the next input datum to generate a selected datum. The input port storage element is configured to receive the selected datum from the input port selector and provide a provided datum passed through or stored in the input port storage element. The provided address is the current input datum substantially throughout the one of the at least one pulse. The single-port (SP) memory is configured to be accessed based on the provided datum by the input port storage element in response to the internal clock signal.

In some embodiments, in a method, based on an external clock signal, an internal clock signal that has at least one pulse during a clock cycle of the external clock signal is generated. A current input datum is selected before a first time within one of the at least one pulse, and a next input datum is selected starting from the first time. The current input datum is provided substantially throughout the one of the at least one pulse. The single-port (SP) memory is accessed using the current input datum in response to the internal clock signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
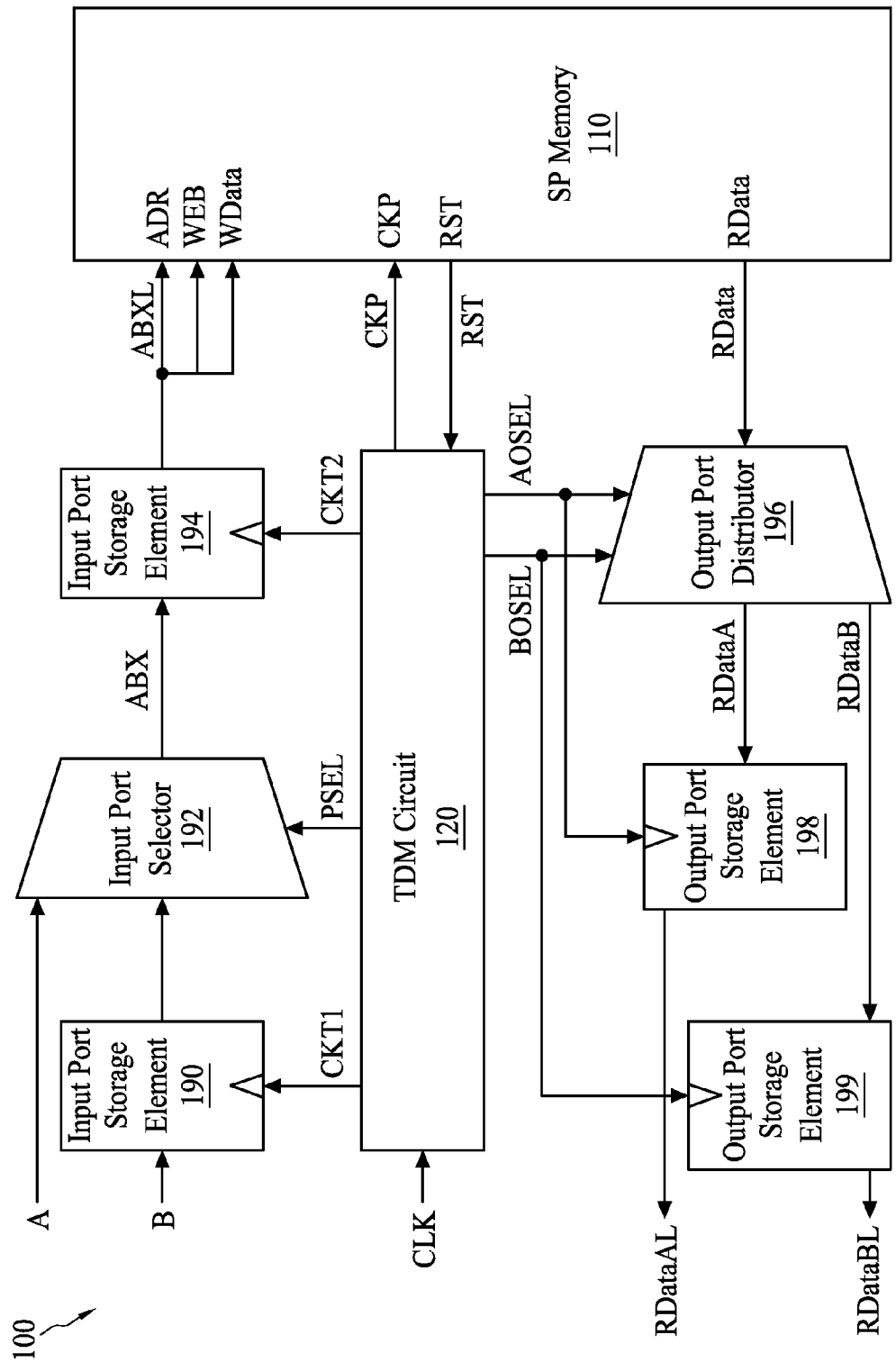
FIG. 1 is a schematic block diagram of an overlapped time division multiplexed dual-port (TDM DP) memory in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present. In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a schematic block diagram of an overlapped time division multiplexed dual-port (TDM DP) memory 100 in accordance with some embodiments. The overlapped TDM DP memory 100 includes a single-port (SP) memory 110, a TDM circuit 120, an input port selector 192, input port storage elements 190 and 194, an output port distributor 196 and output port storage elements 198 and 199.

The TDM circuit 120 is configured to receive an external clock signal CLK, a reset signal RST, and generate an internal clock signal CKP that has a plurality of pulses, such as a first pulse and a second pulse within a clock cycle of the external clock signal CLK. The external clock signal CLK is a clock signal that a system which includes the DP TDM Memory 100 and other components is operated under to synchronize the DP TDM Memory 100 with other components. The reset signal RST is generated by the SP memory 110 to indicate that an operation performed during the first pulse or the second pulse has completed.

The TDM DP memory 100 has a first input port and a second input port for respectively and concurrently receiving an input datum A and input datum B. The TDM circuit 120 is further configured to generate an input port selection signal PSEL and input port storage element clock signals CKT1 and CKT2. When the datum A and datum B are concurrently received, the input port storage element 190 stores the datum B in response to the clock signal CKT1. The input port selector 192 selects the datum A or the stored datum B as a selected datum ABX in response to the input port selection signal PSEL. The input port storage element 194 stores the datum ABX in response to the clock signal CKT2 and provide a datum ABXL to the SP memory 110. Therefore, the datum A and datum B are provided to the SP memory 110 corresponding to the first pulse and the second pulse in sequence. The datum ABXL includes an address ADR to be accessed, a write enable bar WEB signal indicating whether a read operation or a write operation is performed, and a datum to be written WData if a write operation is to be performed.

In case a read operation is to be performed in the first pulse and/or a read operation is to be performed in the second pulse, the SP memory 110 outputs a read datum RData during the first pulse and/or read a datum RData during the second pulse. The TDM circuit 120 is further configured to generate output port selection signals AOSEL and BOSEL. In response to the output port selection signal AOSEL, the output port distributor 196 distributes the datum RData of the first pulse as a datum RDataA to the output port storage element 198 and/or in response to the output port selection signal BOSEL, the output port distributor 196 distributes the datum RData of the second pulse as a datum RDataB to the output port storage element 199. In response to the output port selection signal AOSEL, the output port storage element 198 provides the datum RDataA at a first output port as a datum RDataAL. In response to the output port selection signal BOSEL, the output port storage element 199 provides the datum RDataB at a second output port as a datum RDataBL.

Figure 2:
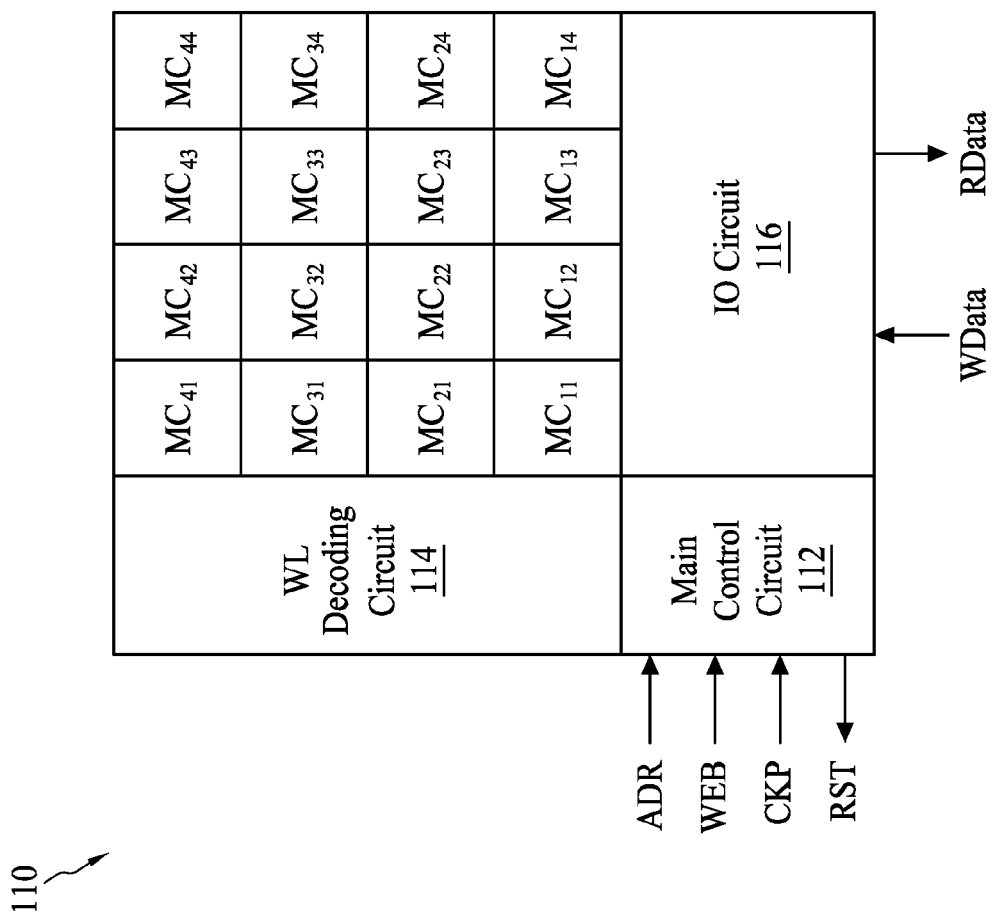
FIG. 2 is a schematic block diagram of the SP memory in accordance with some embodiments.

FIG. 2 is a schematic block diagram of the SP memory 110 in accordance with some embodiments. The SP memory 110 includes SP memory cells $MC_{11}$, $MC_{12}$ ... and $MC_{44}$, a main control circuit 112, a word line (WL) decoding circuit 114 and an IO circuit 116.

Figure 3:
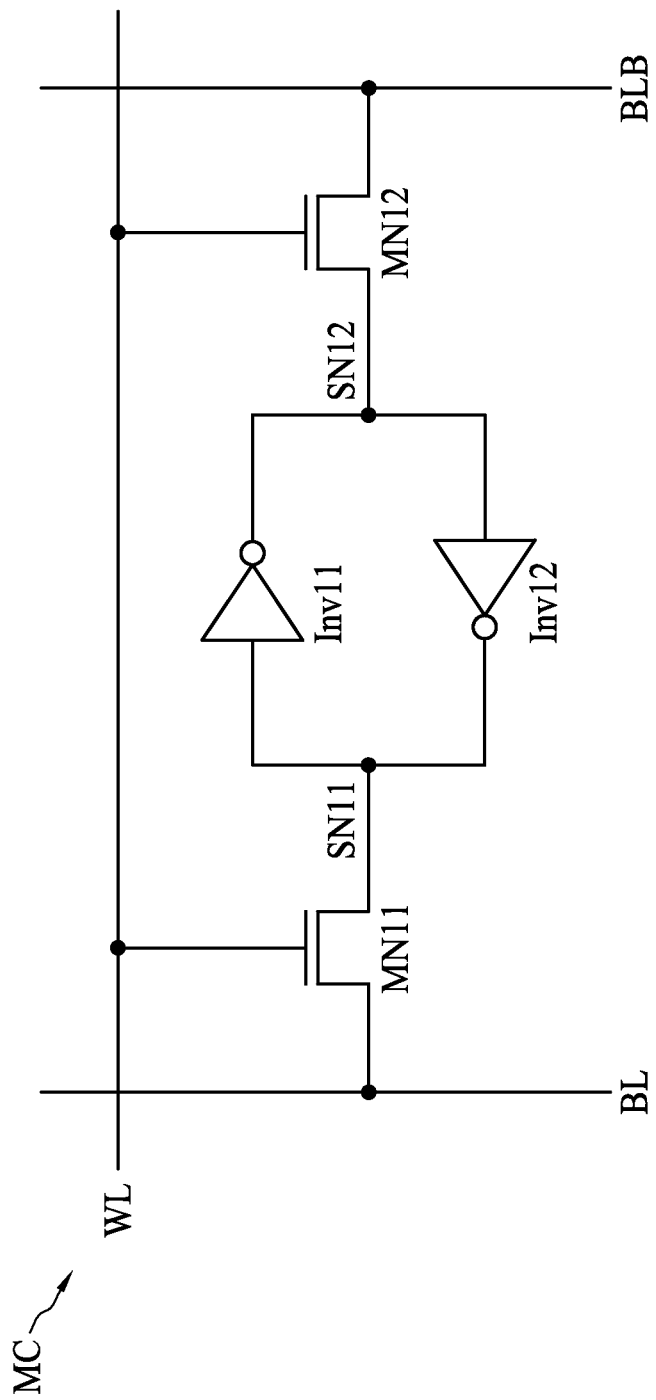
FIG. 3 is a schematic circuit diagram of an exemplary SP memory cell MC in accordance with some embodiments.

The SP memory cells $MC_{11}$, $MC_{12}$ ... and $MC_{44}$ are arranged in an array with rows and columns. FIG. 3 is a schematic circuit diagram of an exemplary SP memory cell MC in accordance with some embodiments. The cell MC is a 6T SRAM cell. The cell MC includes cross-coupled inverters Inv11 and Inv12 and access transistors MN11 and MN12. The cross-coupled inverters Inv11 and Inv12 retain a datum bit at storage nodes SN12 and SN11, respectively. The access transistor MN11 or MN12 controls passing of a datum bit from a bit line BL or a complementary bit line BLB to the storage node SN11 or SN12 in a write operation, and passing of a datum bit from the storage node SN11 or SN12 to the bit line BL or a complementary bit line BLB in a read operation in response to a signal at a word line WL.

Referring to FIG. 2, in the SP memory 110, the main control circuit 112 is configured to receive the address ADR, the write enable bar signal WEB, the internal clock signal CKP, and control the WL decoding circuit 114 and the IO circuits 116 to access an SP memory cell MC at the address ADR in response to the internal clock signal CKP. In some embodiments, the WL decoding circuit 114 is configured to receive a row address pre-decoded by the main control circuit 112, and the internal clock signal CKP, and enables a row x of the SP memory cells $MC_{11}$, $MC_{12}$ ... and $MC_{44}$ for access in response to, for example, a rising edge of a pulse of the internal clock signal CKP. The IO circuit 116 is configured to receive a column address pre-decoded by the main control circuit 112, and send a datum bit of the datum WData to or receive a datum bit of the datum RData from the SP memory cell $MC_{xy}$ in the row x and a column y based on the corresponding operation indicated by the write enable bar signal WEB. In some embodiments, the IO circuit 116 includes a pre-charging circuit, a sense amplifier and a data driver for each column and further includes a column decoding circuit for the columns. The pre-charging circuits, sense amplifiers, data drivers and the column decoding circuit are not shown for simplicity. The pre-charging circuit is configured to pre-charge the corresponding bit line BL and bit line bar BLB (shown in FIG. 3) in response to, for example, a falling edge of a pulse of the internal clock signal CKP to prepare for a subsequent operation. The sense amplifier is configured to sense the datum bit based on differential voltages received through the corresponding bit line BL and complementary bit line BLB during a read operation. The data driver is configured to drive the corresponding bit line BL and complementary bit line BLB based on the datum bit to be written during a write operation. The column decoding circuit is configured to receive the column address from the main control circuit 112, and output the datum bit of the datum RData from the selected sense amplifier or the datum bit of the input datum WData to the selected data driver.

In some embodiments, the main control circuit 112 is further configured to generate the reset signal RST to end an operation controlled by the TDM circuit 120 (in FIG. 1). In some embodiments, the reset signal RST is generated in a self-timed manner. The delay for accessing a memory cell $MC_{xy}$ is tracked using, for example, dummy circuits that imitate the paths traversed starting from the rising edge of the pulse of the internal clock signal CKP to a datum bit being written into the memory cell $MC_{xy}$, or a datum bit in the memory cell $MC_{xy}$ is read out by the IO circuit 116. In other embodiments, the reset signal RST is generated after a fixed delay from the rising edge of the pulse of the internal clock signal CKP. The fixed delay can be generated by logic gates.

For simplicity, the SP memory 110 is exemplarily shown as a single bank memory. A multi-bank memory that is accessed using the main control circuit 112 and localized accessing circuitry for each bank of memories in a hierarchical addressing scheme is within the contemplated scope of the present disclosure.

Figure 4:
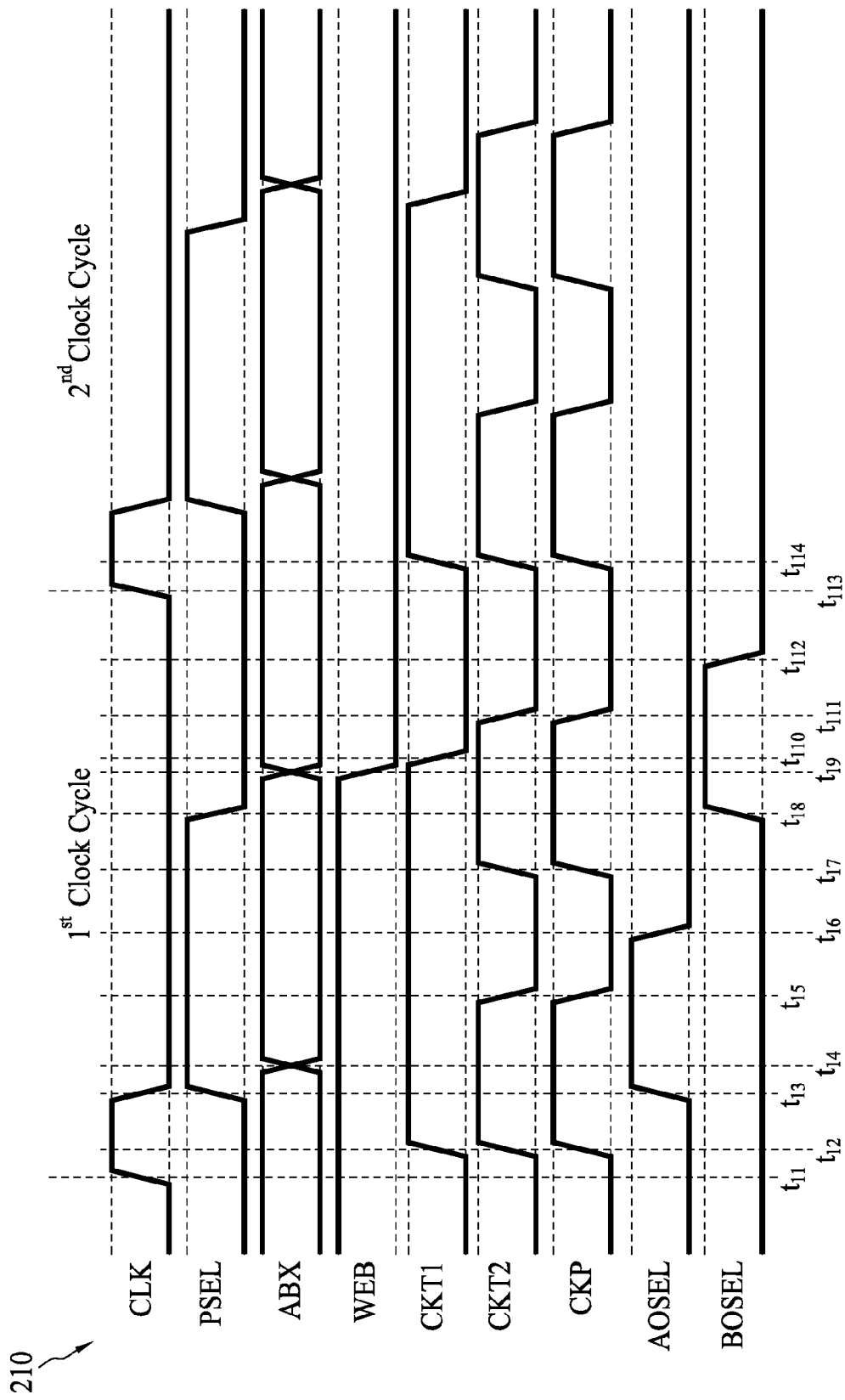
FIG. 4 is a schematic timing diagram illustrating operations of the overlapped TDM-DP memory in accordance with some embodiments.

FIG. 4 is a schematic timing diagram 210 illustrating operations of the overlapped TDM-DP memory 100 in accordance with some embodiments. Referring to FIGS. 1, 2 and 4, at time $t_{11}$, a rising edge of the external clock signal CLK arrives, and a first clock cycle commences. The rising edge of the external clock signal CLK causes the TDM circuit 120 to generate a rising edge of the first pulse of the internal clock signal CKP and rising edges of the clock signals CKT1 and CKT2 at time $t_{12}$. Before the rising edge of the first pulse of the internal clock signal CKP, the input port selection signal PSEL has been low, and therefore the input port selector 192 selects an input datum $A_1$ as a selected datum $ABX_{A1}$ to the input port storage element 194. Meanwhile, the clock signal CKT2 to the input port storage element 194 has been low, and thus allows the datum $ABX_{A1}$ to pass through the input port storage element 194 and be provided as a datum $ABXL_{A1}$ to the SP memory 110. The datum ABXL and similarly the datum ABX includes an address ADR, a write enable bar signal WEB and a datum to be written WData if a write operation is to be performed. The datum ABX and the write enable bar signal WEB are drawn separately in FIG. 1. The write enable bar signal $WEB_{A1}$ has been high before time $t_{11}$, indicating that the operation in the first pulse of the first clock cycle is a read operation. Therefore, the datum $ABX_{A1}$ includes an address $ADR_{A1}$ and the write enable bar signal $WEB_{A1}$. In some embodiments, the main control circuit 112 pre-decodes the address $ADR_{A1}$ and awaits the rising edge of the internal clock signal CKP.

At time $t_{12}$, the rising edge of the first pulse of the internal clock signal CKP arrives, causing a first read operation on a memory cell based on the current input datum, which is the input datum $A_1$ at the time, to commence. Meanwhile, for the input port storage element 190, an input datum $B_1$ has been ready to be stored a setup time before the rising edge of the clock signal CKT1, and therefore, at time $t_{12}$, the input port storage element 190 stores the datum $B_1$. For the input port storage element 194, the datum $ABX_{A1}$ has been ready to be stored a setup time before the rising edge of the clock signal CKT2, and therefore at time $t_{12}$, the input port storage element 194 stores the datum $ABX_{A1}$.

At time $t_{13}$, the input port selection signal PSEL rises. The time $t_{13}$ occurs between the rising edge of the first pulse of the internal clock signal CKP at time $t_{12}$ and a falling edge of the first pulse to occur at time $t_{15}$. The high value of the input port selection signal PSEL causes the input port selector 192 to select the datum $B_1$ stored by the input port storage element 190. Also after some delay with respect to time $t_{12}$, such as at time $t_{13}$, the output port selection signal AOSEL rises, causing the output port distributor 196 to allow a read datum $RData_{A1}$ during the first pulse to be provided as a datum RDataA to the output port storage element 198. Meanwhile, in response to the rising edge of the output port selection signal AOSEL, the output port storage element 198 allows the datum RDataA to pass through and provided at the first output port as a datum RDataAL.

At time $t_{14}$, the input port selector 192 provides the datum $B_1$ as a selected datum $ABX_{B1}$ to the input port storage element 194. In addition, the write enable bar signal $WEB_{B1}$ indicates that another read operation is to be performed in the second pulse the first clock cycle. Therefore, the datum $ABX_{B1}$ includes the address $ADR_{B1}$ and the write enable bar signal $WEB_{B1}$. Meanwhile, the input port storage element 194 is still storing the datum $ABX_{A1}$. Therefore, the input port storage element 194 provides the datum $ABXL_{A1}$ that has the same content as the current input datum $A_1$ to the SP memory 110 substantially throughout the first pulse of the internal clock signal CKP between time $t_{13}$ and time $t_{15}$.

At time $t_{15}$, a falling edge of the first pulse of the internal clock signal CKP arrives and thereby ends the read operation on the memory cell at the address $ADR_{A1}$. Also at time $t_{15}$, a falling edge of the clock signal CKT2 causes the input port storage element 194 to allow the selected datum $ABX_{B1}$ at the time to pass through and provided as a datum $ABXL_{B1}$ to the SP memory 110. Upon receiving the address $ADR_{B1}$, the main control circuit 112 pre-decodes the address $ADR_{B1}$ and awaits the next rising edge of the internal clock signal CKP.

At time $t_{16}$, the output port selection signal AOSEL falls, causing the output port storage element 198 to store the datum RDataA.

At time $t_{17}$, after some delay with respect to the falling edge of the internal clock signal CKP at time $t_{15}$, a rising edge of the second pulse of the internal clock signal CKP and a rising edge of the clock signal CKT2 arrives. The rising edge of the clock signal CKT2 causes the input port storage element 194 to store the datum $ABX_{B1}$, that has the same content as the current input datum $B_1$. The rising edge of the second pulse of the internal clock signal CKP causes the read operation on a memory cell based on the current input datum $B_1$ to commence.

At time $t_{18}$ between the rising edge of the second pulse of the internal clock signal CKP at time $t_{17}$ and a falling edge of the second pulse to occur at time $t_{111}$, the input port selection signal PSEL falls. The low value of the input port selection signal PSEL causes the input port selector 192 to select an input datum $A_2$. Also after some delay with respect to time $t_{17}$, such as at time $t_{18}$, the output port selection signal BOSEL rises, causing the output port distributor 196 to allow a read datum $RData_{B1}$ during the second pulse to be provided as a datum RDataB to the output port storage element 199. Meanwhile, in response to the rising edge of the output port selection signal BOSEL, the output port storage element 199 allows the datum RDataB to pass through and provided at the second output port as RDataBL.

At time $t_{19}$, the input port selector 192 provides the datum $A_2$ as the selected datum $ABX_{A2}$. In addition, the write enable bar signal $WEB_{A2}$ indicates that a write operation is to be performed in a first pulse of a second clock cycle. Therefore, the datum $ABX_{A2}$ includes the address $ADR_{A2}$, the write enable bar signal $WEB_{A2}$ and a datum to be written $WData_{A2}$. Essentially, with respect to the input datum $A_1$ based on which the SP memory 110 is accessed in the first pulse in the first clock cycle, the input datum $A_2$ is a post-next input datum to be accessed in the first pulse in the second clock cycle. Meanwhile, the input port storage element 194 is still storing the datum $ABX_{B1}$ that has the same content as the current input datum $B_1$. Therefore, the input port storage element 194 provides the current input datum $B_1$ to the SP memory 110 substantially throughout the second pulse of the internal clock signal CKP.

At time $t_{110}$, the clock signal CKT1 falls, causing the input port storage element 190 to allow an input datum $B_2$ to pass through so that the datum $B_2$ can be ready to be stored a setup time before the next rising edge of the clock signal CKT1.

At time $t_{111}$, the falling edge of the second pulse of the internal clock signal CKP and a falling edge of the clock signal CKT2 arrive. The falling edge of the second pulse of the internal clock signal CKP ends the read operation based on the input datum $B_1$. The falling edge of the clock signal CKT2 causes the input port storage element 194 to allow the selected datum $ABX_{A2}$ to pass through and provided as a datum $ABXL_{A2}$ to the SP memory 110. The datum $ABXL_{A2}$ is processed similarly as the datum $ABXL_{A1}$ and $ABXL_{B1}$ by the SP memory 110.

At time $t_{112}$, the output port selection signal BOSEL falls, causing the output port storage element 199 to store the datum RDataB.

At time $t_{113}$, another rising edge of the external clock signal CLK arrives, and a second clock cycle commences. The operations in the second clock cycle are substantially similar to those in the first clock cycle, except write operations are performed. At time $t_{114}$, the write operation based on the input datum $A_2$ commences.

In the embodiments described with reference to FIG. 4, during the first pulse between time $t_{12}$ and time $t_{15}$, the input port selection signal PSEL is pulled up to select the next input datum $B_1$ at time $t_{13}$. The datum $ABX_{A1}$ is updated to the datum $ABX_{B1}$ at time $t_{14}$. In this way, the datum $ABX_{B1}$ has been updated by time $t_{15}$ when the input storage element 194 is allowed to pass through the datum $ABX_{B1}$ as the datum $ABXL_{B1}$ to SP memory 110. Therefore, the duration between the first pulse and the second pulse in the first clock cycle, i.e., from time $t_{15}$ to time $t_{17}$, does not need to cover the delay for the datum ABX to be updated. Similarly, during the second pulse between time $t_{17}$ and time $t_{111}$, the input port selection signal PSEL is pulled down to select the datum $A_2$ at time $t_{18}$. The datum $ABX_{B1}$ is updated to the datum $ABX_{A2}$ at time $t_{19}$. In this way, the datum $ABX_{A2}$ has been updated by the time the input port storage element 194 is allowed to pass through the datum $ABX_{A2}$ as the datum $ABXL_{A2}$ to the SP memory 110. Therefore, the duration between the second pulse in the first clock cycle and the first pulse in the second clock cycle, i.e. from time $t_{111}$ to time $t_{114}$, does not need to cover the delay for the selected datum ABX to be updated. Because both the pulse for accessing the SP memory 110 based on the input datum $A_1$ is overlapped with a time period during which the input datum $B_1$ is selected by the input port selection signal PSEL, and the pulse for accessing the SP memory 110 based on the input datum $B_1$ is overlapped with a time period during which the input datum $A_2$ is selected by the input port selection signal PSEL, the memory 100 is described as an overlapped TDM DP memory 100.

Figure 5:
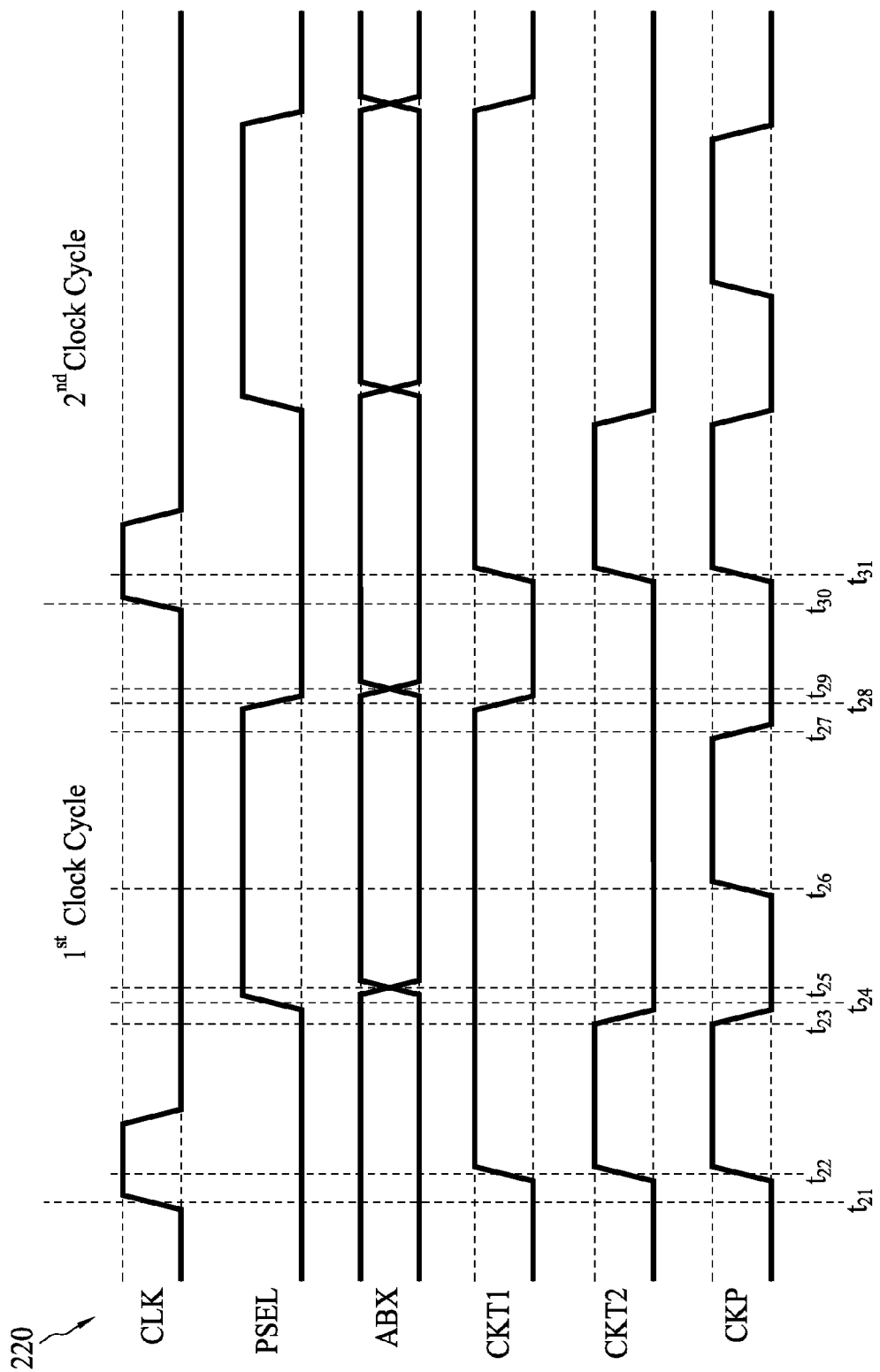
FIG. 5 is a schematic timing diagram illustrating operations of a non-overlapped TDM DP memory.

In comparison, FIG. 5 is a schematic timing diagram 220 illustrating operations of a non-overlapped TDM DP memory. Compared to the timing diagram 210 in FIG. 4, during the first clock cycle between time $t_{21}$ and time $t_{30}$, the input port selection signal PSEL is pulled up to cause the datum $B_1$ to be selected at time $t_{24}$, a time after the first pulse of the internal clock signal CKP between time $t_{22}$ and time $t_{23}$. At time $t_{23}$, the clock signal CKT2 falls and the input port storage element 194 allows a datum to be passed through and to the SP memory 110. However, the datum $ABX_{A1}$ is not updated to the datum $ABX_{B1}$ until time $t_{25}$, causing the main control circuit 112 to wait for the address $ADR_{B1}$ after the falling edge of the first pulse of the internal clock signal CKP at time $t_{23}$. Hence, the duration between the first pulse and the second pulse, i.e. from time $t_{23}$ to time $t_{26}$, has to cover the delay for the datum ABX to be updated. Similar to the first pulse of the internal clock signal CKP in the first clock cycle, the input port selection signal PSEL is not pulled down until time $t_{28}$ which is after the second pulse between time $t_{26}$ and $t_{27}$. The main control circuit 112 has to wait for the next address $ADR_{A2}$ to arrive at time $t_{29}$. The duration between the second pulse in the first clock cycle and the first pulse in the second clock cycle, i.e. from time $t_{27}$ to $t_{31}$, has to cover the delay for the selected datum ABX to be updated. Because both the pulse for accessing the SP memory 110 based on the input datum $A_1$ is not overlapped with a time period during which the input datum $B_1$ is selected and the pulse for accessing the SP memory 110 based on the input datum $B_1$ is not overlapped with a time period during which the input datum $A_2$ is selected, the memory is described as a non-overlapped TDM DP memory.

Figure 6:
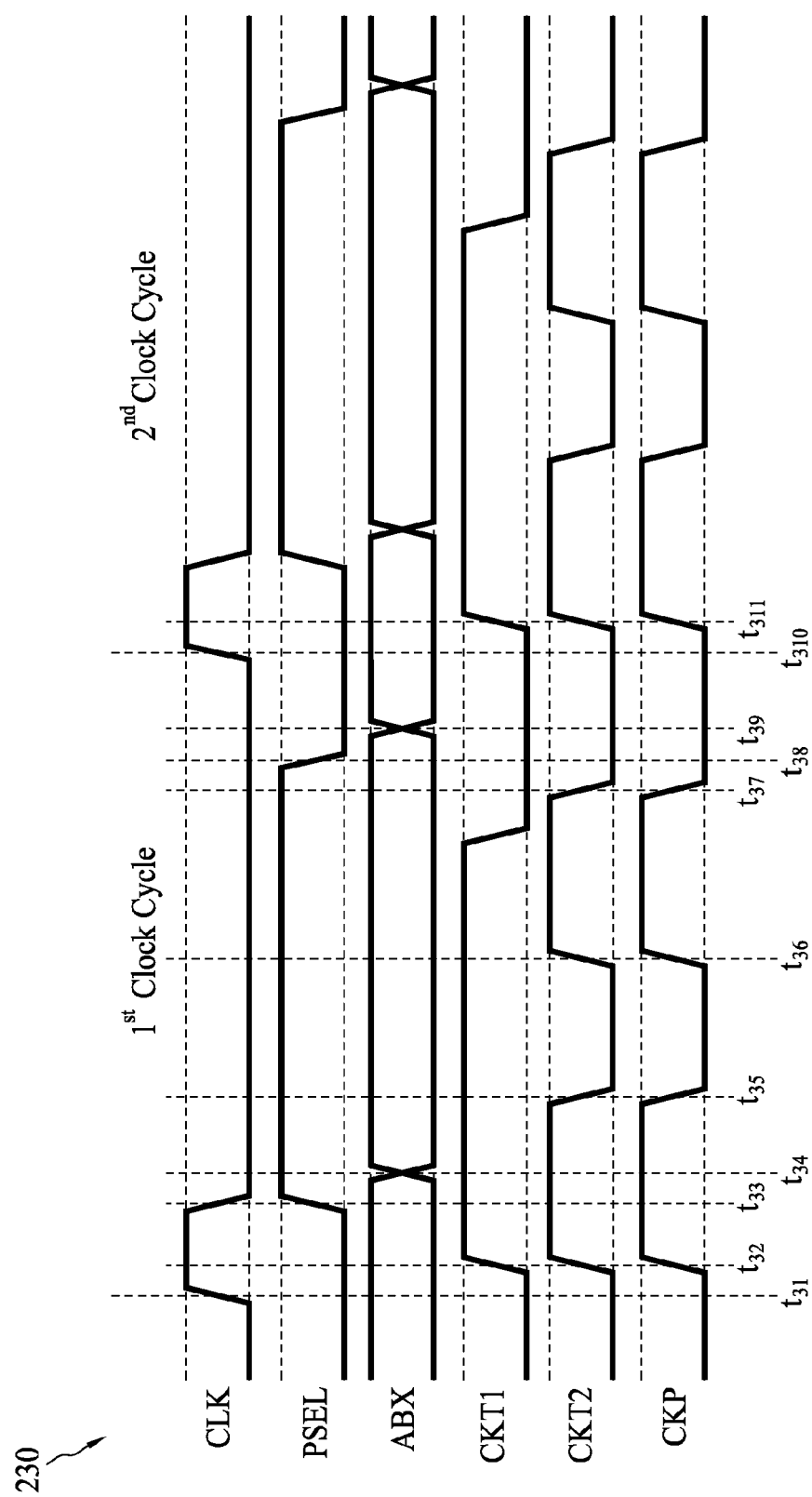
FIG. 6 is a schematic timing diagram illustrating operations of a half-overlapped TDM DP memory in accordance with some embodiments.

FIG. 6 is a schematic timing diagram 230 illustrating operations of a half-overlapped TDM DP memory in accordance with some embodiments. In a first clock cycle between time $t_{31}$ and time $t_{310}$, the first pulse occurs between time $t_{32}$ and time $t_{35}$. Similar to the timing diagram 210 in FIG. 4, during the first pulse in the timing diagram 230, the input port selection signal PSEL is pulled up to select the next input datum $B_1$ at time $t_{33}$. The selected datum $ABX_{A1}$ is updated to the datum $ABX_{B1}$ at time $t_{34}$. In this way, the datum $ABX_{A1}$ has been updated to the datum $ABX_{B1}$ by the time the input port storage element 194 is allowed to pass through the datum $ABX_{B1}$ as the datum $ABXL_{B1}$ to the SP memory 110. Therefore, the duration between the first pulse and the second pulse in the first clock cycle, i.e. from time $t_{35}$ to time $t_{36}$, does not need to cover the delay for the datum ABX to be updated. In contrast to the timing diagram 210 in FIG. 4, the input port selection signal PSEL is pulled down at time $t_{38}$, which is after the second pulse between time $t_{36}$ and time $t_{37}$. The main control circuit 112 has to wait for the datum $ABX_{A2}$ to arrive at time $t_{39}$. The duration between the second pulse in the first clock cycle and the first pulse in the second clock cycle, i.e. from time $t_{37}$ to $t_{311}$, has to cover the delay for the datum ABX to be updated. Because the pulse for accessing the SP memory based on the input datum $A_1$ is overlapped with a time period during which the input datum $B_1$ is selected, and the pulse for accessing the SP memory 110 based on the input datum $B_1$ is not overlapped with a time period during the input datum $A_2$ is selected, the memory is described as a half-overlapped TDM DP memory. Overlapping during the second pulse instead of the first pulse is within the contemplated scope of the present disclosure.

Figure 7:
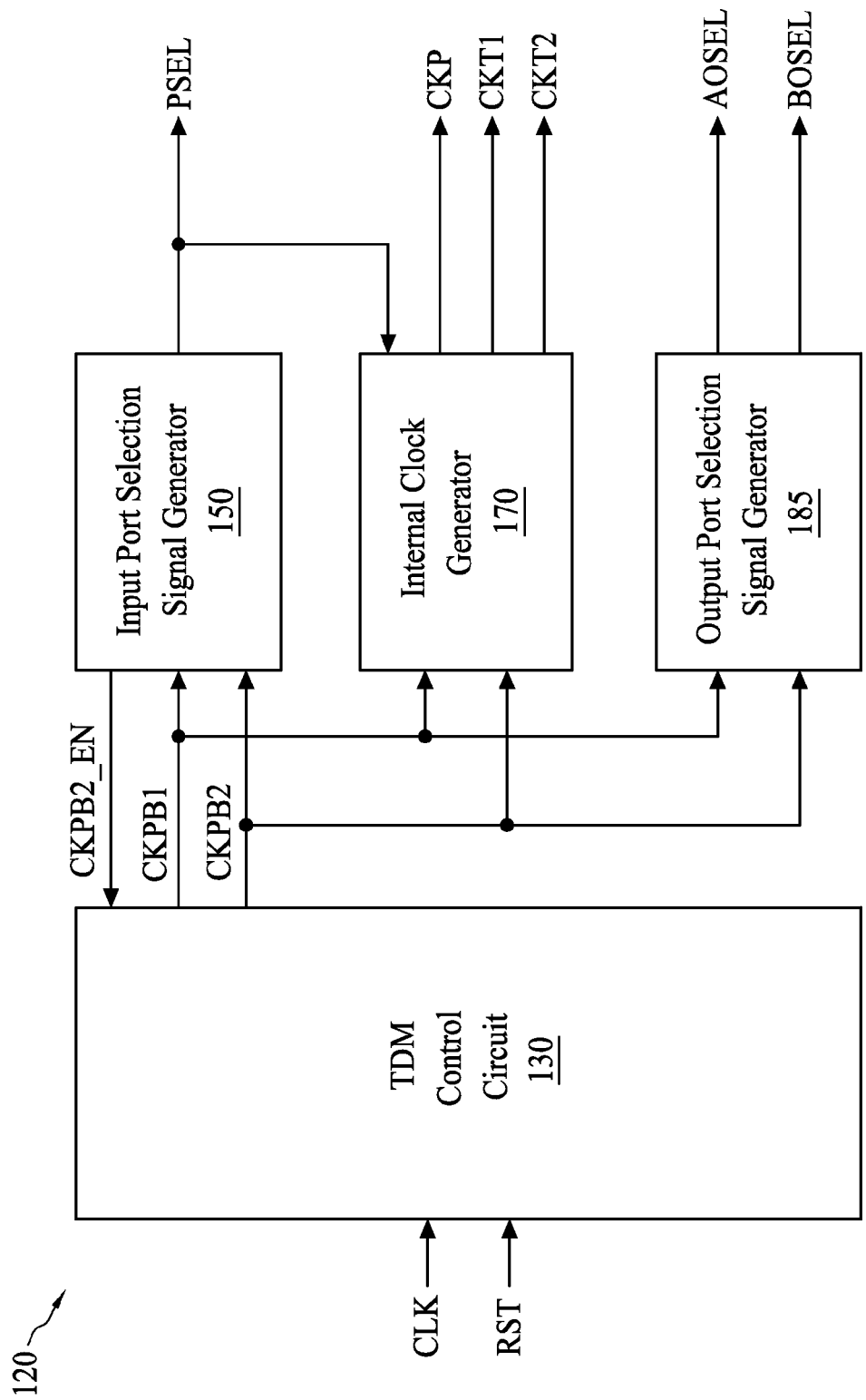
FIG. 7 is a schematic block diagram of the TDM circuit in FIG. 1 in accordance with some embodiments.

FIG. 7 is a schematic block diagram of the TDM circuit 120 in FIG. 1 in accordance with some embodiments. The TDM circuit 120 includes a TDM control circuit 130, an input port selection signal generator 150, an internal clock generator 170 and an output port selection signal generator 185. The TDM control circuit 130 is configured to receive the external clock signal CLK, the reset signal RST, and a second pulse enable signal CKPB2_EN and generates a pulse control signal CKPB1 and a pulse control signal CKPB2. The input port selection signal generator 150 is configured to receive the pulse control signals CKPB1 and CKPB2, and generate the input port selection signal PSEL and the second pulse enable signal CKPB2_EN. The internal clock generator 170 is configured to receive the pulse control signals CKPB1 and CKPB2 and the input port selection signal PSEL, and generate the internal clock signal CKP, and the clock signals CKT1 and CKT2 to the input port storage elements 190 and 194, respectively. The output port selection signal generator 185 is configured to receive the pulse control signals CKPB1 and CKPB2 and generate output port selection signals AOSEL and BOSEL.

Figure 8:
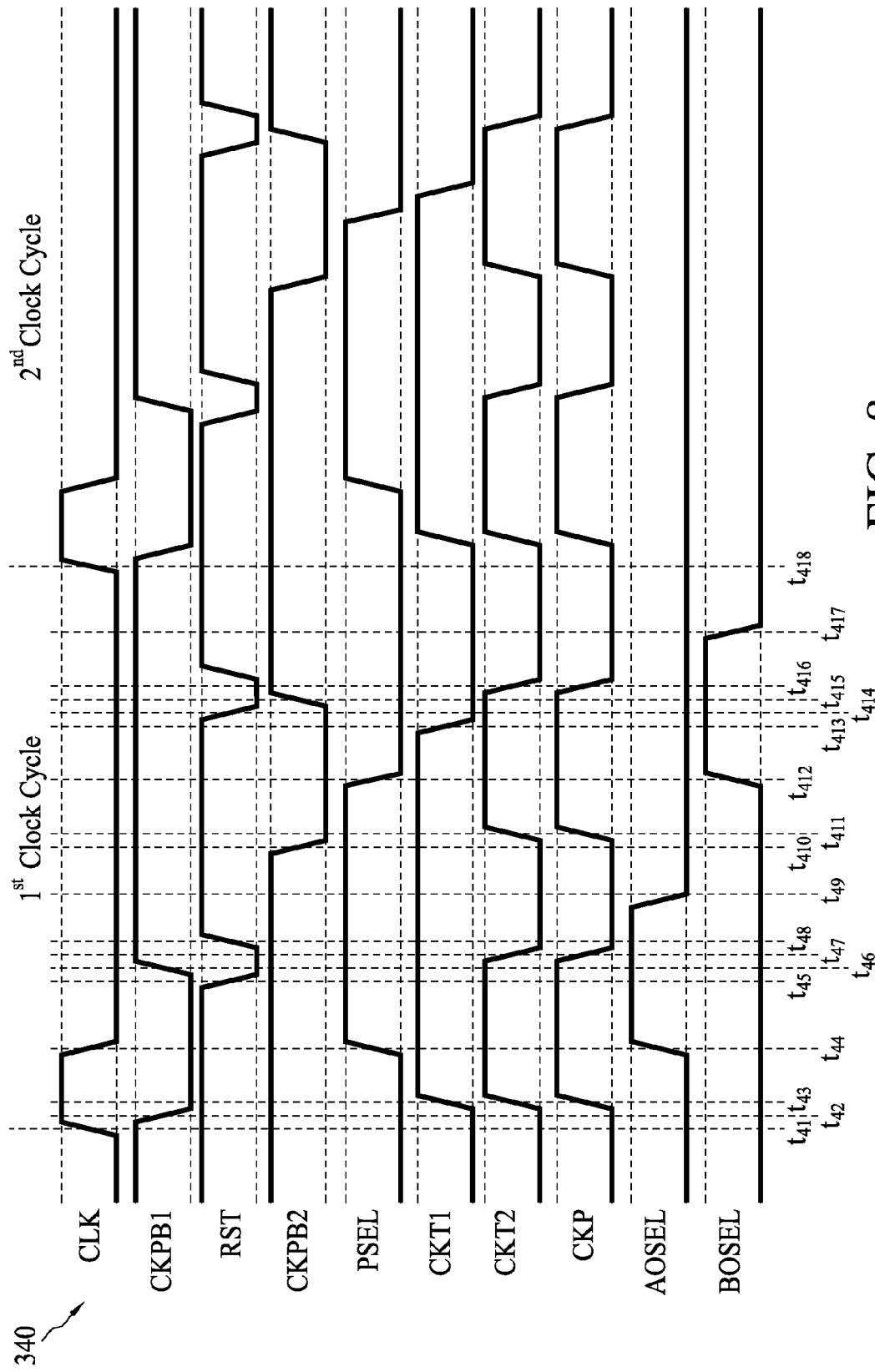
FIG. 8 is a schematic timing diagram illustrating operations of the TDM circuit in FIG. 7 in accordance with some embodiments.

FIG. 8 is a schematic timing diagram 210 illustrating operations of the TDM circuit 120 in FIG. 7 in accordance with some embodiments. Referring to FIGS. 7 and 8, at time $t_{41}$, a rising edge of the external clock signal CLK arrives, and a first clock cycle commences. The rising edge of the external clock signal CLK causes the TDM control circuit 130 to assert the pulse control signal CKPB1 with a low value at time $t_{42}$. The falling edge of the pulse control signal CKPB1 causes the internal clock generator 170 to generate a rising edge of the first pulse of the internal clock signal CKP and rising edges of the clock signals CKT1 and CKT2 at time $t_{43}$. The falling edge of the pulse control signal CKPB1 at time $t_{42}$ further causes the input port selection signal generator 150 to pull up the input port selection signal PSEL at time $t_{44}$. The falling edge of the pulse control signal CKPB1 at time $t_{43}$ causes the TDM control circuit 130 to assert the output port selection signal AOSEL with the high value at time $t_{44}$.

After some delay with respect to the rising edge of the first pulse of the internal clock signal CKP at time $t_{43}$, the main control circuit 112 (shown in FIG. 2) asserts the reset signal RST with the low value at time $t_{45}$. In some embodiments, the delay is determined in a self-timed manner by tracking the delay for traversing the path to access the memory cell at the address $ADR_{A1}$. In other embodiments, the delay is a fixed delay that is common to access of each of the memory cells in the SP memory 110. The assertion of the reset signal RST at time $t_{45}$ causes the TDM control circuit 130 to deassert the pulse control signal CKPB1 with a high value at time $t_{46}$. The deassertion of the pulse control signal CKPB1 at time $t_{46}$ causes the internal clock generator 170 to generate the falling edge of the first pulse of the internal clock signal CKP and a falling edge of the clock signal CKT2 at time $t_{47}$. The falling edge of the first pulse of the internal clock signal CKP at time $t_{47}$ causes the SP memory 110 to deassert the reset signal RST with the high value at time $t_{48}$. The rising edge of the pulse control signal CKPB1 at time $t_{46}$ causes the TDM control circuit 130 to deassert the output port selection signal AOSEL at time $t_{49}$.

In some embodiments, the second pulse enable signal CKPB2_EN (not shown in FIG. 8) is generated as an inverted signal of the input port selection signal PSEL, and enables the arrival of the rising edge of the reset signal RST at time $t_{48}$ to cause the TDM control circuit 130 to assert the pulse control signal CKPB2 with the low value at time $t_{410}$. The assertion of the pulse control signal CKPB2 at time $t_{410}$ causes the internal clock generator 170 to generate a rising edge of the second pulse of the internal clock signal CKP and a rising edge of the clock signal CKT2 at time $t_{411}$. The falling edge of the pulse control signal CKPB2 at time $t_{410}$ further causes the input port selection signal generator 150 to pull down the input port selection signal PSEL at time $t_{412}$. The falling edge of the pulse control signal CKPB2 at time $t_{410}$ also causes the TDM control circuit 130 to assert the output port selection signal BOSEL with the high value at time $t_{412}$.

The falling edge of the input port selection signal PSEL at time $t_{412}$ and the high state of the pulse control signal CKPB1 cause the clock signal CKT1 to fall at time $t_{413}$. After some delay with respect to the rising edge of the second pulse of the internal clock signal CKP at time $t_{411}$, the main control circuit 112 asserts the reset signal RST with a low value at time $t_{414}$. The delay is determined similarly as for the first pulse of the internal clock signal CKP. The assertion of the reset signal RST at time $t_{414}$ causes the TDM control circuit 130 to deassert the pulse control signal CKPB2 with the high value at time $t_{415}$. The deassertion of the pulse control signal CKPB2 causes the internal clock generator 170 to generate the falling edge of the second pulse of the internal clock signal CKP and a falling edge of the clock signal CKT2 at time $t_{416}$. The rising edge of the pulse control signal CKPB2 at time $t_{415}$ also causes the TDM control circuit 130 to deassert the output port selection signal BOSEL at time $t_{417}$.

At time $t_{418}$, another rising edge of the external clock signal arrives, and a second clock cycle commences. The operations in the second clock cycle is substantially similar to those in the first clock cycle, except write operations are performed, and therefore the output port selection signals AOSEL and BOSEL stay in the low state.

Figure 9:
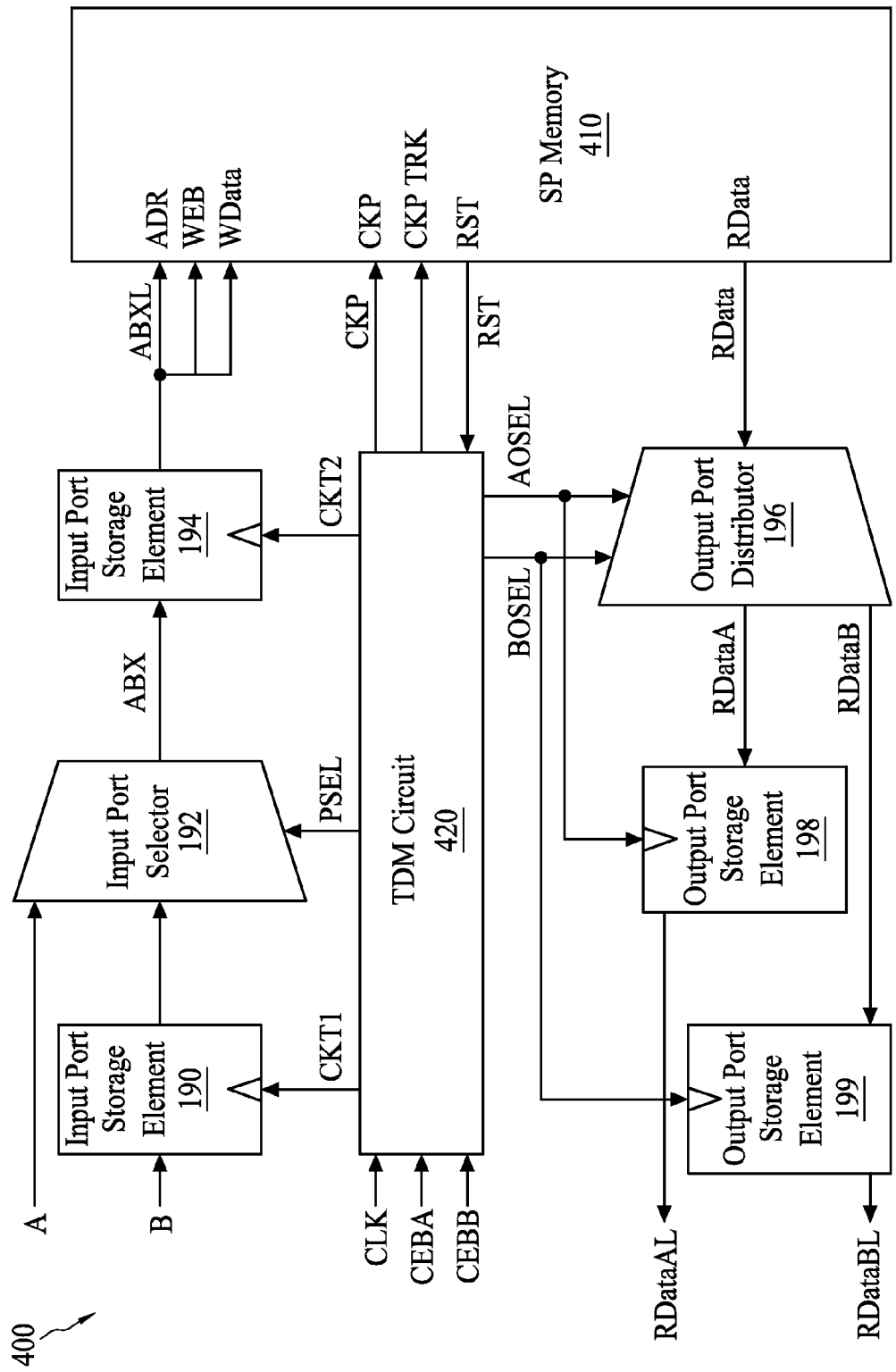
FIG. 9 is a schematic block diagram of an overlapped TDM DP memory in accordance with other embodiments.

FIG. 9 is a schematic block diagram of an overlapped TDM DP memory 300 in accordance with other embodiments. Compared to the overlapped TDM-DP memory 100 in FIG. 1, the overlapped TDM-DP memory 400 in FIG. 9 adopts an internal clock with track signal CKP_TRK that allows timing of a second pulse in a situation where there is only the second pulse in a clock cycle to be the same as timing of a second pulse in a situation where there are a first pulse and the second pulse in a clock cycle. The overlapped TDM DP memory 400 includes an SP memory 410, a TDM circuit 420, an input port selector 192 and input port storage elements 190 and 194, an output port distributor 196 and output port storage elements 198 and 199. In addition to the external clock signal CLK and the reset signal RST, the TDM circuit 420 further receives chip enable signals CEBA and CEBB, and further generates the internal clock with track signal CKP_TRK.

Compared to the SP memory 110 in FIG. 1, the SP memory 410 is further configured to receive the internal clock with track signal CKP_TRK, and generate the reset signal RST that causes the generation of the second pulse in the internal clock signal CKP and the internal clock with track signal CKP_TRK. In the situation where only one read or write operation is performed in a clock cycle, such as when only the chip enable signal CEBB is asserted, the internal clock signal CKP has only the second pulse. Without the first pulse, assertion of the reset signal RST that triggers the generation of the second pulse can have unknown delay due to missing of a reference starting point for tracking an access delay or for a fixed delay. The internal clock with track signal CKP_TRK generates the first pulse regardless whether a read or write operation is performed during the first pulse. In some embodiments, a default input datum A is supplied to the SP memory 410 for tracking an access time during the first pulse of the internal clock with track signal CKP_TRK. Therefore, the reset signal RST will assert after a tracked access delay or a fixed delay from the rising edge of the first pulse of the internal clock with track signal CKP_TRK.

Figure 10:
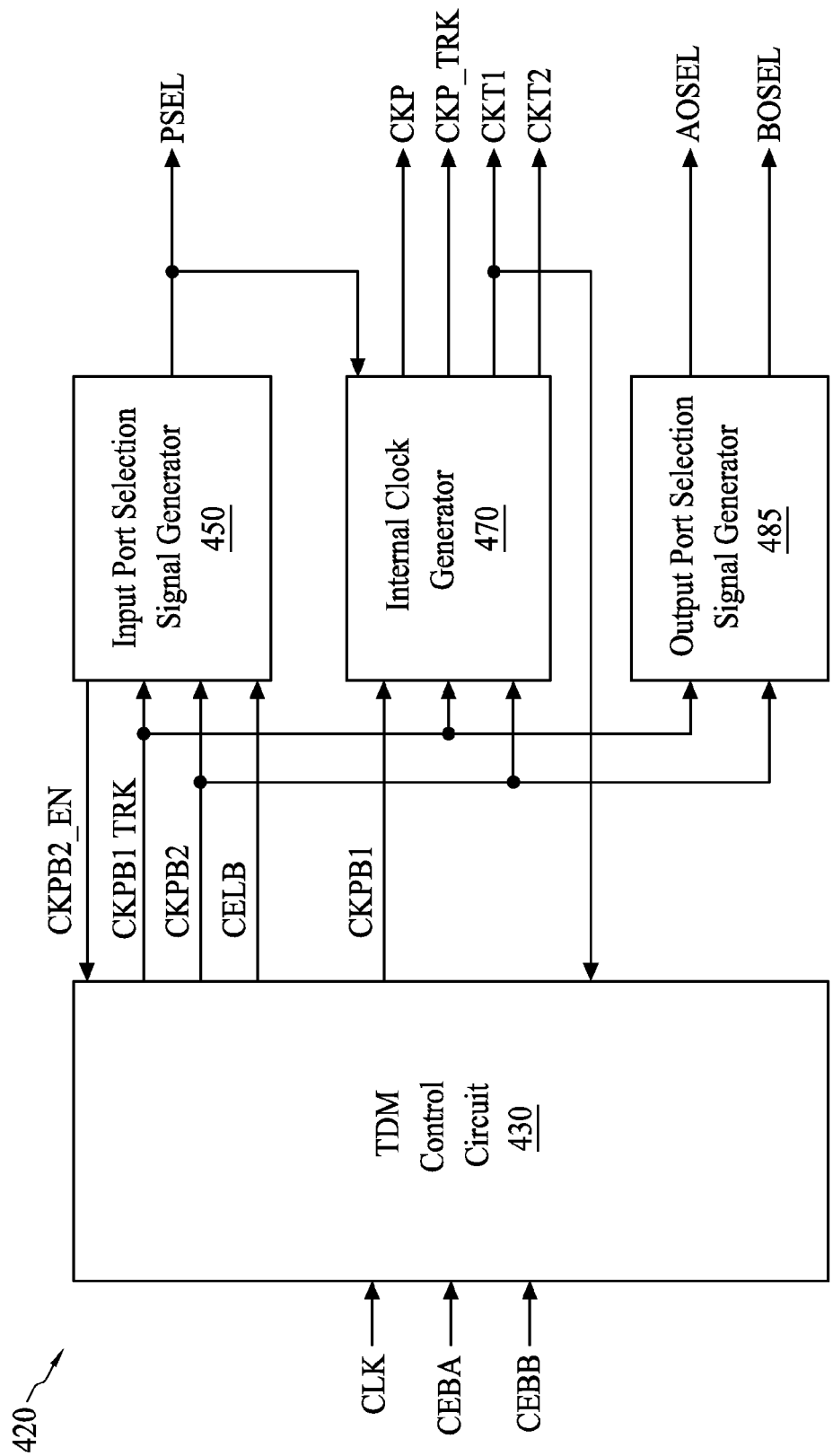
FIG. 10 is a schematic block diagram of the TDM circuit in FIG. 9 in accordance with some embodiments.

FIG. 10 is a schematic block diagram of the TDM circuit 420 in FIG. 9 in accordance with some embodiments. The TDM circuit 420 includes a TDM control circuit 430, an input port selection signal generator 450, an internal clock generator 470 and an output port selection signal generator 485. Compared to the TDM control circuit 130 in FIG. 7, the TDM control circuit 430 is further configured to receive the chip enable signals CEBA and CEBB and the input port storage element clock signal CKT1, and further generates a pulse control with track signal CKPB1_TRK, and a stored chip enable signal CELB. The chip enable signal CEBA is asserted when an input datum A is available in a clock cycle. The chip enable signal CEBB is asserted when an input datum B is available in the clock cycle. Compared to the input port selection signal generator 150 in FIG. 7, the input port selection signal generator 450 is configured to receive the pulse control with track signal CKPB1_TRK instead of the pulse control signal CKPB1, and receive the pulse control signal CKPB2 and the stored chip enable signal CELB to generate the input port selection signal PSEL. Compared to the internal clock generator 170 in FIG. 7, the internal clock generator 470 is further configured to receive the pulse control with track signal CKPB1_TRK and further generates the internal clock with track signal CKP_TRK. The output port selection signal generator 485 is configured to receive the pulse control with track signal CKPB1_TRK instead of the pulse control signal CKPB1 to generate the output port selection signals AOSEL and BOSEL.

Figure 11:
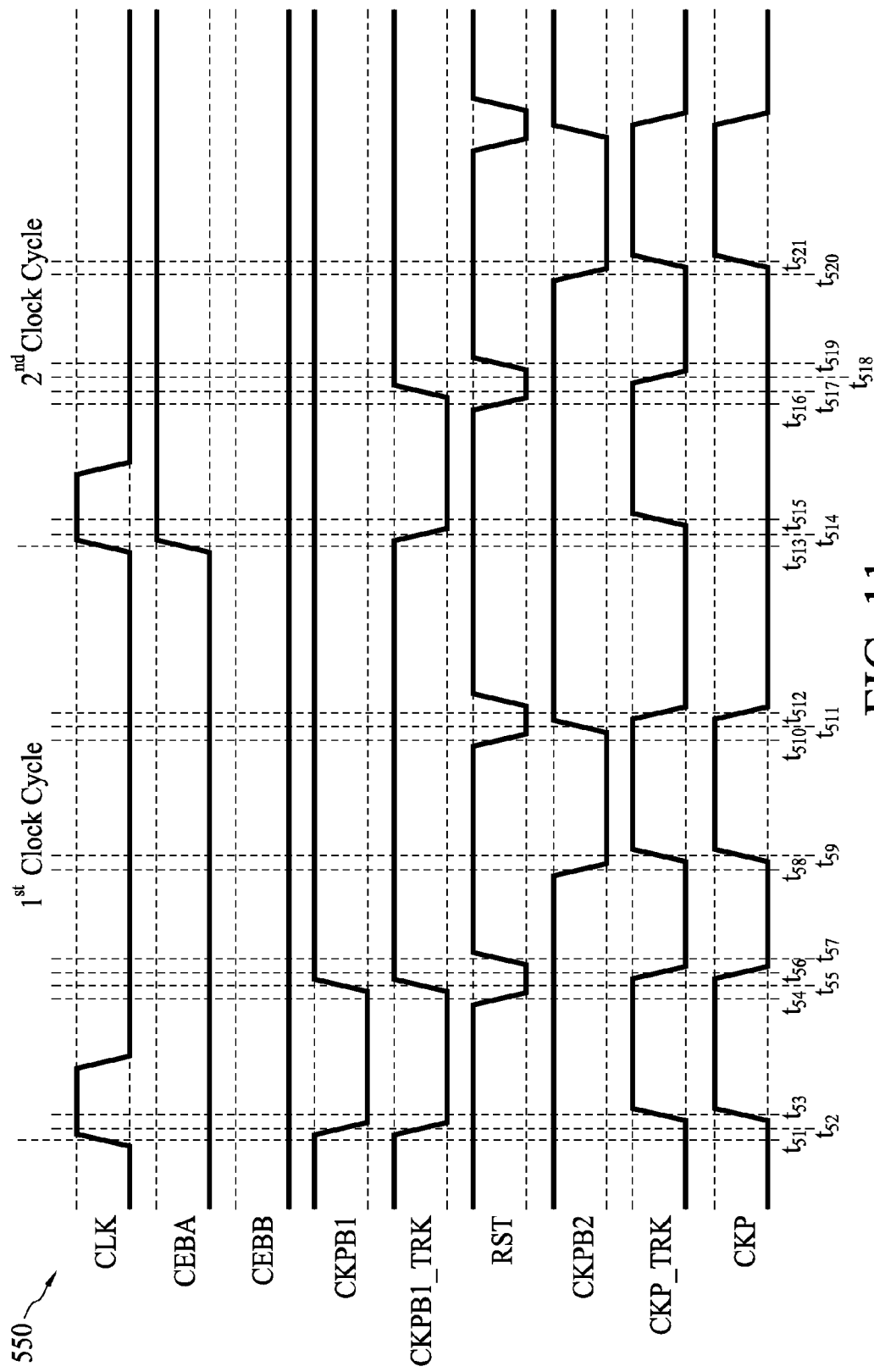
FIG. 11 is a schematic timing diagram illustrating operations of the overlapped TDM DP memory in FIG. 9 in accordance with some embodiments.

FIG. 11 is a schematic timing diagram 550 illustrating operations of the overlapped TDM DP memory 400 in FIG. 9 in accordance with some embodiments. In a first clock cycle, a read or write operation is performed based on an input datum $A_1$ during a first pulse, and a read or write operation is performed based on an input datum $B_1$ during a second pulse. In a second clock cycle, a read or write operation is performed only based on an input datum $B_2$ during a second pulse.

At time $t_{51}$, a rising edge of the external clock signal CLK arrives, and the first clock cycle commences. During the first clock cycle, the chip enable signal CEBA is asserted with the low value, indicating the input datum $A_1$ is available in the first clock cycle. The chip enable signal CEBB is asserted with the low value, indicating the input datum $B_1$ is available in the first clock cycle. Because the chip enable signal CEBA is asserted, the TDM control circuit 430 is enabled to assert the pulse control signal CKPB1 at time $t_{52}$ in response to the rising edge of the external clock signal CLK. Similarly, because either the chip enable signal CEBA or the chip enable signal CEBB is asserted, the TDM control circuit 430 is enabled to assert the pulse control with track signal CKPB1_TRK in response to the rising edge of the external clock signal CLK. The assertion of the pulse control signal CKPB1 causes a rising edge of a first pulse to be generated in the internal clock signal CKP at time $t_{53}$. The assertion of the pulse control with track signal CKPB1_TRK causes a rising edge of the first pulse to be generated in the internal clock with track signal CKP_TRK at time $t_{53}$. The rising edge of the first pulse of the internal clock signal CKP at time $t_{53}$ causes the read or write operation based on the input datum $A_1$ to commence. After some delay with respect to the rising edge of the first pulse of the internal clock with track signal CKPB_TRK at time $t_{53}$, the SP memory 410 asserts the reset signal RST with the low value at time $t_{54}$. The delay is determined similarly as the embodiments described with reference to FIG. 8. The assertion of the reset signal RST at time $t_{54}$ causes the TDM control circuit 430 to deassert the pulse control signal CKPB1 and the pulse control with track signal CKPB1_TRK with the high value at time $t_{55}$, which in turn causes the falling edge of the first pulse of the internal clock signal CKP and the internal clock with track signal CKP_TRK, respectively, at time $t_{56}$, and therefore ends the read or write operation based on the input datum $A_1$.

The falling edge of the internal clock with track signal CKP_TRK causes the SP memory 410 to deassert the reset signal RST with the high value at time $t_{57}$ The second pulse enable signal CKPB2_EN (not shown in FIG. 11) is at the low state and enables the arrival of the rising edge of the reset signal RST to cause the TDM control circuit 130 to assert the pulse control signal CKPB2 with the low value at time $t_{58}$, which in turn causes a rising edge of the second pulse of the internal clock signal CKP and the internal clock with track signal CKP_TRK at time $t_{59}$. The rising edge of the second pulse of the internal clock signal CKP at time $t_{59}$ causes the read or write operation based on the input datum $B_1$ to commence. After some delay with respect to the rising edge of the second pulse of the internal clock with track signal CKPB_TRK at time $t_{59}$, the SP memory 410 asserts the reset signal RST with the low value at time $t_{510}$, which in turn causes the pulse control signal CKPB2 to deassert with the high value at time $t_{511}$. The deassertion of the pulse control signal CKPB2 causes a falling edge of the second pulse of the internal clock signal CKP and the internal clock with track signal CKP_TRK at time $t_{512}$ and therefore ends the read or write operation based on the input datum $B_1$.

At time $t_{513}$, a rising edge of the external clock signal CLK arrives, and the second clock cycle commences. The chip enable signal CEBA is deasserted with the high value, indicating the input datum $A_2$ is not available in the second clock cycle. The chip enable signal CEBB is asserted with the low value, indicating the input datum $B_2$ is available in the clock cycle. Because the chip enable signal CEBA is deasserted, the TDM control circuit 430 is not enabled to assert the pulse control signal CKPB1 at time $t_{514}$, which in turn causes a first pulse to be not generated in the internal clock signal CKP. Therefore, a read or write operation is not performed. On the other hand, because the chip enable signal CEBB is asserted, even though the chip enable signal CEBA is deasserted, the TDM control circuit 430 still asserts the pulse control with track signal CKPB1_TRK with the low value at time $t_{514}$. The assertion of the pulse control with track signal CKPB1_TRK causes the internal clock generator 470 to generate a rising edge of the first pulse of the internal clock with track signal CKP_TRK at time $t_{515}$. After some delay with respect to the rising edge of the first pulse of the internal clock with track signal CKP_TRK at time $t_{515}$, the SP memory 410 asserts the reset signal RST with the low value time $t_{516}$. The assertion of the reset signal RST at time $t_{516}$ causes the TDM control circuit 430 to deassert the pulse control with track signal CKPB1_TRK with the high value at time $t_{517}$ which in turn causes the internal clock generator 470 to generate a falling edge of the first pulse of the internal clock with track signal CKP_TRK at time $t_{518}$.

The falling edge of the internal clock with track signal CKP_TRK causes the SP memory 410 to deassert the reset signal RST with the high value at time $t_{519}$. The second pulse enable signal CKPB2_EN (not shown in FIG. 11) is at the low state and enables the arrival of the rising edge of the reset signal RST to cause the TDM control circuit 430 to assert the pulse control signal CKPB2 with the low value at time $t_{520}$ which in turn causes the internal clock generator 470 to generate a rising edge of the second pulse of the internal clock signal CKP and a rising edge of the second pulse of the internal clock with track signal CKP_TRK at time $t_{521}$. The rising edge of the second pulse of the internal clock signal CKP at time $t_{521}$ causes a read or write operation based on the datum $B_2$ to commence.

Therefore, in the second clock cycle, even though the input datum $A_2$ is not available, and hence the internal clock signal CKP does not have the first pulse, the second pulse of the internal clock signal CKP is still generated after a known delay from the falling edge of the first pulse of the internal clock with track signal CKP_TRK.

Referring to FIGS. 9 and 11, in the present embodiments, the internal clock signal CKP is shown to have at least one pulse during one clock cycle of the external clock signal CLK. The TDM DP memory 400 that is also capable of not generating any pulse in one clock cycle in response to the deasserted chip enable signals CEBA and CEBB is within the contemplated scope of the present disclosure.

Figure 12:
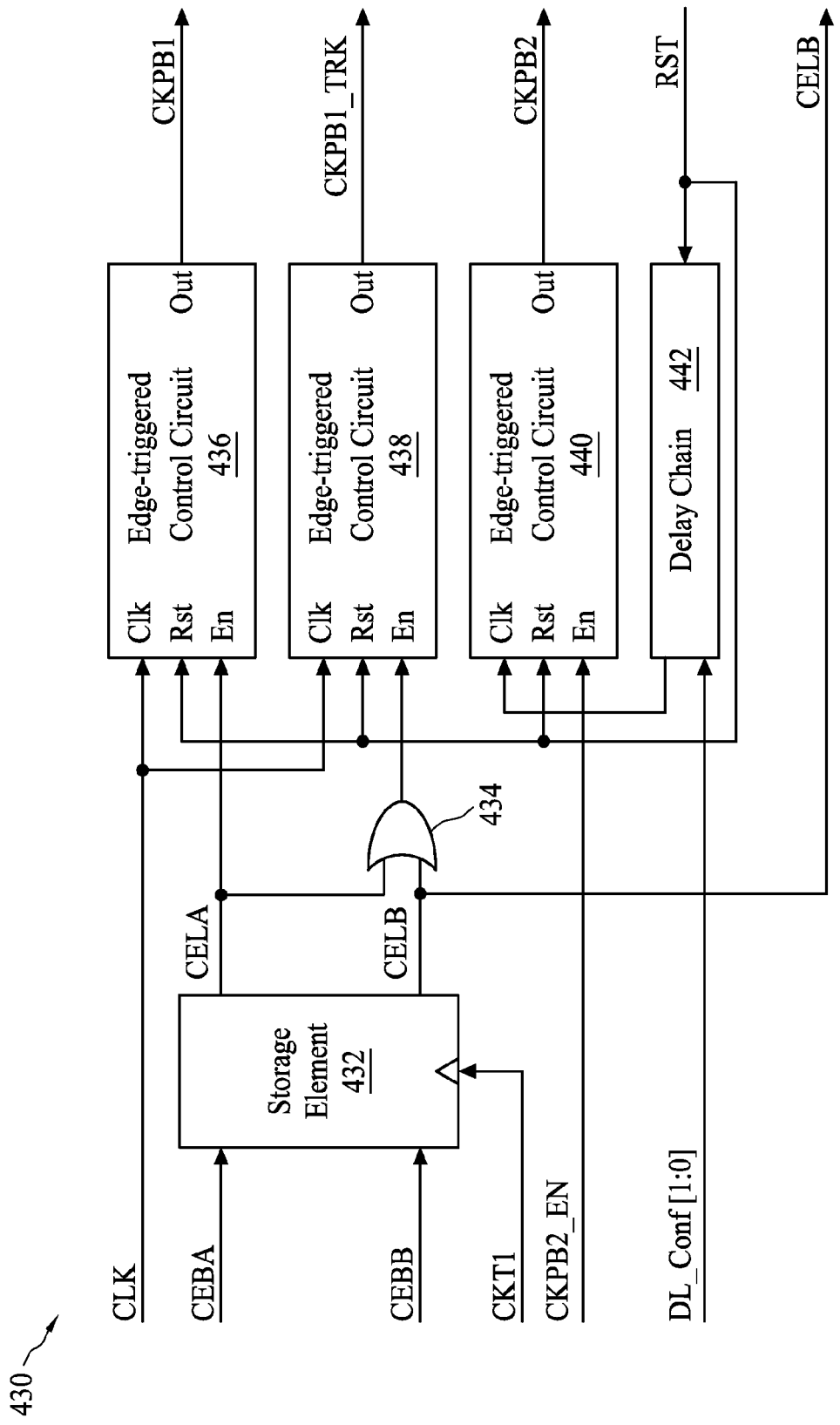
FIG. 12 is a schematic block diagram of the TDM control circuit in FIG. 10 in accordance with some embodiments.

FIG. 12 is a schematic block diagram of the TDM control circuit 430 in FIG. 10 in accordance with some embodiments. The TDM control circuit 430 includes edge-triggered control circuits 436, 438 and 440, and circuits for driving the inputs of the edge-triggered control circuits 436, 438 and 440 such as a storage element 432, an OR gate 434 and a delay chain 442. The TDM control circuit 430 is configured to receive the external clock signal CLK, the chip enable signals CEBA and CEBB, the input port storage element clock signal CKT1, the second pulse enable signal CKPB2_EN, a delay configuration signal D_L Conf[1:0] and the reset signal RST, and generate the pulse control signal CKPB1, the pulse control with track signal CKPB1_TRK and the pulse control signal CKPB2.

In the TDM control circuit 430, the storage element 432 receives the chip enable signals CEBA and CEBB and generates stored chip enable signals CELA and CELB based on the input port storage element clock signal CKT1. Each of the edge-triggered control circuit 436, 438 and 440 are configured with a clock input pin Clk, a reset input pin Rst and an enable input pin En, and an output pin Out. Each of the edge-triggered control circuits 436, 438 and 440 is configured to assert a signal at its output pin Out when a signal to its enable input pin EN is enabled and a clock edge of a signal to its clock input pin Clk arrives, and deassert the signal at its output pin Out when a signal to its reset input pin Rst is asserted. The edge-triggered control circuit 436 receives the external clock signal CLK at its clock input pin Clk, the reset signal RST at its reset input pin Rst, and the stored chip enable signal CELA at its enable input pin En, and generates the pulse control signal CKPB1 at its output pin Out. Therefore, referring also to the first clock cycle in FIG. 11, the pulse control signal CKPB1 is asserted when the chip enable signal CEBA and therefore the stored chip enable signal CELA are asserted with the low value, and the rising edge of the external clock signal CLK arrives, and deasserted when the reset signal RST is asserted with the low value. Compared to the edge-triggered control circuit 436, the edge-triggered control circuit 438 receives an ORed result of the stored chip enable signals CELA and CELB from the OR gate 434 at its enable input pin En. Therefore, referring also to the second clock cycle in FIG. 11, the pulse control with track signal CKPB1_TRK is asserted when either or both of the chip enable signals CELA and CELB are asserted, and the rising edge of the external clock signal CLK arrives.

In the TDM control circuit 430, the delay chain 442 receives the reset signal RST, and the delay configuration signal DL_Conf[1:0], and generates a delayed reset signal which is the reset signal RST delayed by a delay configured using the delay configuration signal DL_Conf[1:0]. The edge-triggered control circuit 440 receives the delayed reset signal at its clock input pin Clk, the reset signal RST at its reset input pin Rst, and the second pulse enable signal CKPB2_EN at its enable input pin En, and generates the pulse control signal CKPB2 at its output pin Out. Therefore, referring to also the first clock cycle or the second clock cycle in FIG. 11, the pulse control signal CKPB2 is asserted when the second pulse enable signal CKPB2_EN (not shown in FIG. 11) is at the low state and therefore enables the edge-triggered control circuit 440, and a rising edge of the delayed reset signal arrives, and is deasserted when the reset signal RST is asserted.

Figure 13:
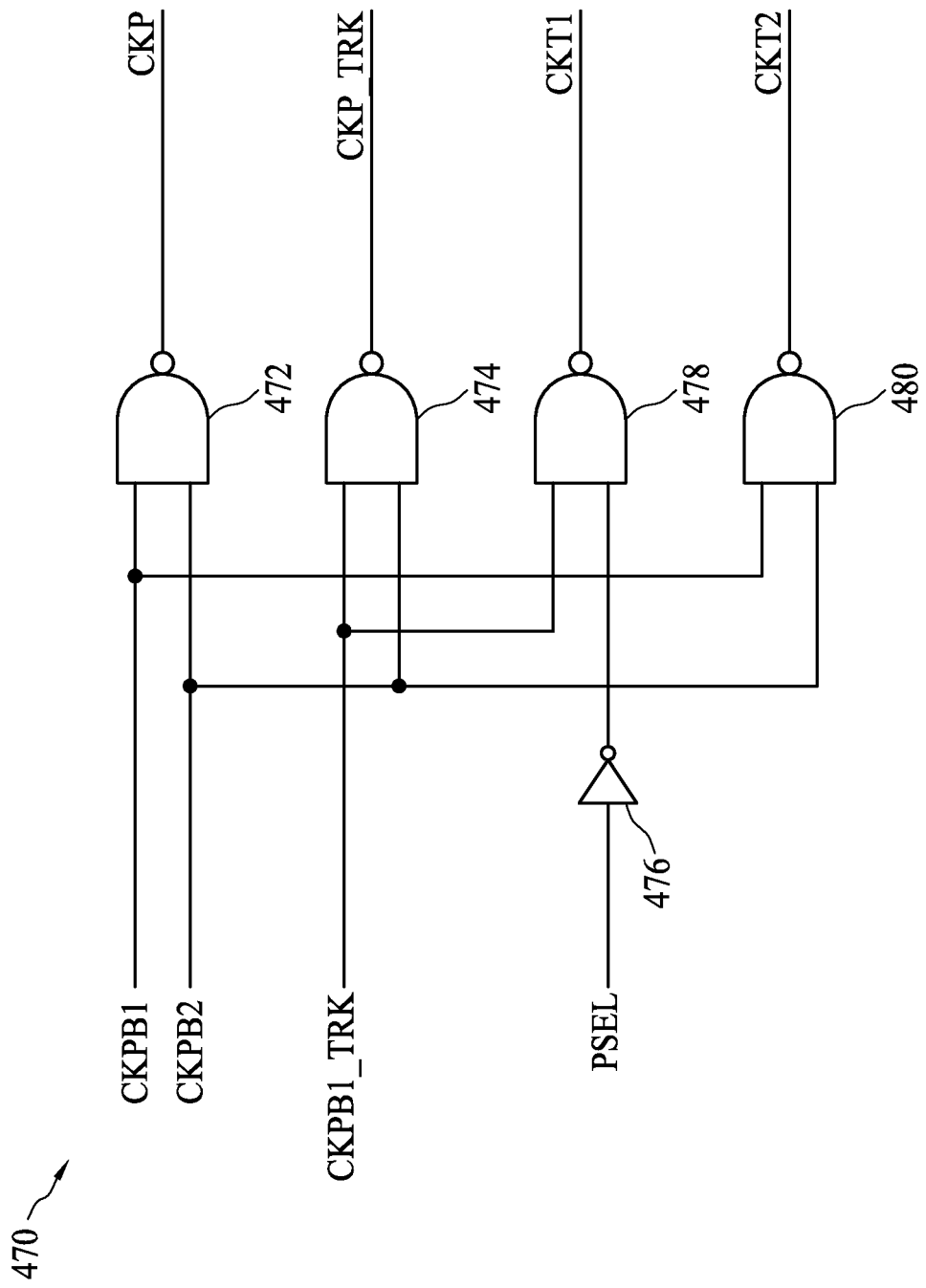
FIG. 13 is a schematic circuit diagram of the internal clock generator in FIG. 10 in accordance with some embodiments.

FIG. 13 is a schematic circuit diagram of the internal clock generator 470 in accordance with some embodiments. The internal clock generator 470 includes NAND gates 472, 474, 478 and 480, and an inverter 476. The NAND gate 472 receives the pulse control signals CKPB1 and CKPB2, and generates the internal clock signal CKP. The NAND gate 474 receives the pulse control with track signal CKPB1_TRK and the pulse control signal CKPB2, and generates the internal clock with track signal CKP_TRK. The inverter 476 receives the input port selection signal PSEL and generates an inverted input port selection signal. The NAND gate 478 receives the pulse control with track signal CKPB1_TRK, and the inverted input port selection signal, and generates the input port storage element clock signal CKT1. The NAND gate 480 receives the pulse control signal CKPB1 and the pulse control signal CKPB2, and generates the input port storage element clock signal CKT2.

Referring to both FIG. 11 and FIG. 13, because the internal clock signal CKP is the NANDed result of the pulse control signals CKPB1 and CKPB2, when either the pulse control signal CKPB1 or the pulse control signal CKPB2 is asserted with the low value, the internal clock signal CKP is generating a pulse, and when both the pulse control signals CKPB1 and CKPB2 are deasserted, the internal clock signal CKP is not generating the pulse. For the internal clock with track signal CKP_TRK, when either the pulse control with track signal CKPB1_TRK or the pulse control signal CKPB2 is asserted with the low value, the internal clock with track signal CKP_TRK is generating a pulse, and when both the pulse control with track signal CKPB1_TRK and the pulse control signal CKPB2 are deasserted, the internal clock with track signal CKP_TRK is not generating the pulse.

Referring to both FIG. 8 and FIG. 13, the input port storage element clock signal CKT1 is the NANDed result of the pulse control with track signal CKPB1_TRK and the inverted input port selection signal. Therefore, the input port storage element 190 in FIG. 9 is passing through a datum when the pulse control with track signal CKPB1_TRK is deasserted with the high value (i.e. not during a time period corresponding to the first pulse), and the input port selection signal PSEL is in the low state (i.e. the input datum A is selected). The input port storage element 190 is storing a datum when either the pulse control with track signal CKPB1_TRK is asserted with the low value (i.e. during the time period corresponding to the first pulse), or the input port selection signal is in the high state (i.e. the input datum B is selected).

Referring to both FIG. 8 and FIG. 13, the input port storage element clock signal CKT2 is the NANDed result of the pulse control signal CKPB1, and the pulse control signal CKPB2. Therefore, the input port storage element 194 in FIG. 9 is passing through a datum when both the pulse control signal CKPB1 and the pulse control signal CKPB2 are deasserted with the high value, and is storing a datum when either the pulse control signal CKPB1 or the pulse control signal CKPB2 is asserted with the low value.

Figure 14:
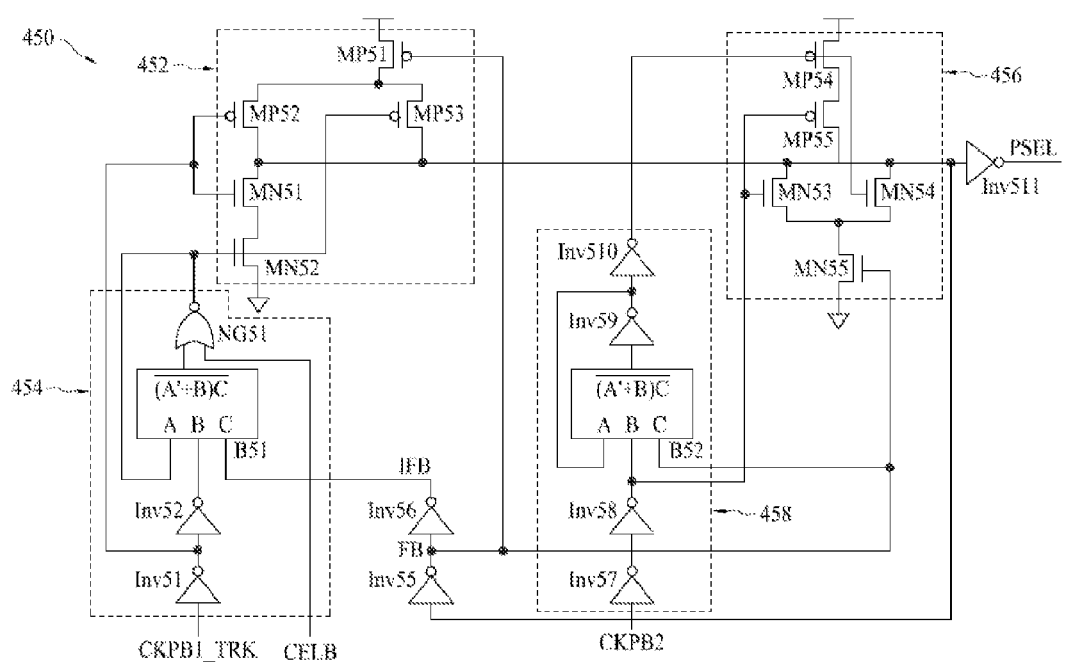
FIG. 14 is a schematic circuit diagram of the input port selection signal generator in FIG. 10 in accordance with some embodiments.

FIG. 14 is a schematic circuit diagram of the input port selection signal generator 450 in accordance with some embodiments. The input port selection signal generator 450 includes a first unit 452, a driver unit 454 for the first unit 452, a second unit 456, a driver unit 458 for the second unit 456, an output inverter Inv511, and feedback inverters Inv55 and Inv56. The output invertor Inv 511 receives an output of the second unit 456 at an input of the output inverter Inv511 and generates the input port selection signal PSEL at the output of the output inverter Inv511. The feedback inverter Inv55 receives the output of the second unit 456 at an input of the feedback inverter Inv55 and generates a feedback input port selection signal FB at an output of the feedback inverter Inv55. The feedback inverter Inv56 receives the feedback input port selection signal FB at an input of the feedback inverter Inv56 and generates an inverted feedback input port selection signal IFB at an output of the feedback inverter Inv56.

The first unit 452 and the driver unit 454 are configured to receive the pulse control with track signal CKPB1_TRK, the stored chip enable signal CELB, and an inverted feedback input port selection signal IFB, and causes the input port selection signal PSEL to pull up when the stored chip enable signal CELB has been asserted with the low value, the inverted feedback input port selection signal IFB has been in the high state, and the pulse control with track signal CKPB1_TRK is transitioning from the high state to the low state. Once the input port selection signal PSEL is pulled up, the second unit 456 and the driver unit 458 are configured to keep the input port selection signal PSEL at the high state. The second unit 456 and the driver unit 458 are further configured to receive the pulse control signal CKPB2 and the feedback input port selection signal FB, and causes the input port selection signal PSEL to pull down when the feedback input port selection signal FB has been in the high state, and the pulse control signal CKPB2 is transitioning from the high state to the low state. Once the input port selection signal PSEL is pulled down, the first unit 452 and the driver unit 454 are further configured to keep the input port selection signal PSEL at the low state.

The driver unit 454 includes inverters Inv51 and Inv52, a block B51, and an NOR gate NG51. The first unit 452 includes PMOSs MP51, MP52 and MP53, and NMOSs MN51 and MN52. In the driver unit 454, the inverter Inv51 receives the internal clock with track signal CKPB1_TRK at an input, and is coupled to an input of the inverter Inv52 at an output. The block B51 has inputs A, B and C, and is configured to generate $\overline{(A'+B)C}$ at its output, where A' is a stored signal of the input A. The block B51 receives an output of the NOR gate NG51 feedback to the input A, an output of the inverter Inv52 at the input B and the inverted feedback input port selection signal IFB at the input C. The NOR gate NG51 receives the output of the block B51 at a first input, and the stored chip enable signal CELB at a second input. In the first unit 452, a source of the PMOS MP51 is coupled to a power supply and a gate of the PMOS MP51 is coupled to the feedback input port selection signal FB. Sources of the PMOSs MP52 and MP53 are coupled together and are coupled to a drain of the PMOS MP51. Drains of the PMOSs MP52 and MP53 are coupled together and are coupled to the input of the output inverter Inv511. A gate of the PMOS MP52 is coupled to the output of the inverter Inv51. A gate of the PMOS MP53 is coupled to the output of the NOR gate NG51. A drain of the NMOS MN51 is coupled to the drains of the PMOSs MP52 and MP53 which are coupled to the input of the output inverter Inv511. A gate of the NMOS MN51 is coupled to the output of the inverter Inv51. A source of the NMOS MN51 is coupled to a drain of the NMOS MN52. A gate of the NMOS MN52 is coupled to the output of the NOR gate NG51. A source of the NMOS MN52 is coupled to ground.

The driver unit 458 includes inverters Inv57, Inv58, Inv59 and Inv510 and block B52. The second unit 456 includes PMOSs MP54 and MP55, and NMOSs MN53, MN54 and MN55. In the driver unit 448, the inverter Inv57 receives the internal clock signal CKPB2 at an input, and is coupled to an input of the inverter Inv58 at an output. The block B52 has inputs A, B and C, and is configured to generate $\overline{(A'+B)C}$ at its output, where A' is a stored signal of the input A. The block B52 receives an output of the inverter Inv59 feedback to the input A, an output of the inverter Inv58 at the input B, and the feedback input port selection signal FB at the input C. The inverter Inv59 receives the output of the block B52 at an input, and is coupled to an input of the inverter 510 at the output. A source of the PMOS MP54 is coupled to the power supply and a gate of the PMOS MP54 is coupled to an output of the inverter Inv510. A source of the PMOS MP55 is coupled to a drain of the PMOS MP54, a gate of the PMOS MP55 is coupled to the output of the inverter Inv58, and a drain of the PMOS MP55 is coupled to the input of the output inverter Inv511. Drains of the NMOSs MN53 and MN54 are coupled together and are coupled to the drain of the PMOS MP55, and hence are coupled to the input of the output inverter Inv511. A gate of the NMOS MN53 is coupled to the output of the inverter Inv58. A gate of the NMOS MN54 is coupled to the output of the inverter Inv510. Sources of the NMOSs MN53 and MN54 are coupled together and are coupled to a drain of the NMOS MN55. A gate of the NMOS MN55 is coupled to the feedback input port selection signal FB. A source of the NMOS MN55 is coupled to ground.

Referring to both FIG. 8 and FIG. 14, before time $t_{41}$, the input port selection signal PSEL is in the low state, and therefore the inverted feedback input port selection signal IFB is in the high state. The pulse control with track signal CKPB1_TRK (not shown in FIG. 8, but is the same as the pulse control signal CKPB1 for the purpose of description here) is in the high state. Hence, the block B51 receives the high states at the inputs B and C, causing the output of the block B51 to be in the low state. The stored chip enable signal CELB (not shown in FIG. 8 but is the same as the stored chip enable signal CELB shown in FIG. 11) is in the low state. Because both of the inputs of the NOR gate NG51 are in the low state, the output of the NOR gate NG51 is in the high state and thereby turns on the NMOS MN52 and awaits the NMOS MN51 to be turned on. In the first clock cycle, at time $t_{42}$, the pulse control with track signal CKPB1_TRK is asserted with the low value. The high to low transition of the pulse control with track signal CKPB1_TRK causes the output of the inverter Inv51 to experience a low to high transition, which in turn causes the NMOS MN51 to be turned on. Therefore, the input of the output inverter Inv511 is pulled down by the path through the NMOSs MN51 and MN52, and the input port selection signal PSEL is pulled up at time $t_{44}$.

After the input of the output inverter Inv511 is pulled down, the inverted feedback input port selection signal IFB is pulled down, causing the output of the block B51 to be pulled up and the output of the NOR gate NG51 to be pulled down. The NMOS MN52 is therefore turned off. Meanwhile, because the pulse control signal CKPB2 has been deasserted with the high value, the NMOS MN53 in the second unit 356 has been turned on. After the input of the output inverter Inv511 is pulled down, the feedback input port selection signal FB is pulled up, causing the NMOS MN55 to be turned on. Therefore, the input of the output inverter Inv511 is continued to be in the low state due to the pull down path through the NMOSs MN53 and MN55 in the second unit 456. As a result, the input port selection signal PSEL is kept at the high state from time $t_{44}$ to time $t_{411}$.

Between time $t_{44}$ and time $t_{411}$, the input port selection signal PSEL is in the high state, and therefore the feedback input port selection signal FB is in the high state. The pulse control signal CKPB2 is in the high state and therefore the output of the inverter Inv58 is in the high state. The block B52 receives the high states at both the input B and the input C and therefore generates the low state at the output, which in turn causes the low state to be generated at the output of the inverter Inv510. The PMOS MP54 is therefore turned on and awaits the PMOS MP55 to be turned on. At time $t_{49}$, the pulse control signal CKPB2 is asserted with the low value. The high to low transition of the pulse control signal CKPB2 causes the output of the inverter Inv58 to experience a high to low transition and thereby turn on the PMOS MP55. Therefore, the input of the output inverter Inv511 is pulled up by the path through the PMOSs MP54 and MP55, and the input port selection signal PSEL is pulled down at time $t_{411}$.

After the input of the output inverter Inv511 is pulled up, the feedback input port selection signal FB is pulled down, causing the output of the block B52 to be pulled up and the output of the inverter Inv510 to be pulled up. The PMOS MP54 is therefore turned off. Meanwhile because the pulse control with track signal CKPB1_TRK is deasserted with the high value, the PMOS MP52 in the first unit 352 has been turned on. After the input of the output inverter Inv511 is pulled up, the feedback input port selection signal FB is pulled down, causing the PMOS MP51 to be turned on. Therefore, the input of the output inverter Inv511 is continued to be in the high state due to the pull up path through the PMOSs MP51 and MP52. As a result the input port selection signal PSEL is kept at the low state starting from time $t_{411}$ to the end of the first clock cycle at time $t_{416}$.

Having only one inverter Inv51 between the pulse control with track signal CKPB1_TRK and the gate of the NMOS MN51 is exemplary. The number of inverters between the pulse control with track signal CKPB1_TRK and the gate of the NMOS MN51 is determined with respect to the time when the input port selection signal PSEL rises during the first pulse. Similarly, having two inverters Inv57 and Inv58 between the pulse control signal CKPB2 and the gate of the PMOS MP55 is exemplary. The number of inverters between the pulse control signal CKPB2 and the gate of the PMOS MP55 is determined with respect to the time when the input selection signal PSEL falls during the second pulse.

Some embodiments have one or a combination of the following features and/or advantages. In some embodiments of an overlapped TDM DP memory, a TDM circuit is configured to generate an internal clock signal that has at least one pulse during a clock cycle of the external clock signal, cause an input port selector to select a current input datum before a first time within one of the at least one pulse, and select a next input datum starting from the first time to generate a selected datum and an input port storage element to provide the current input datum substantially throughout the one of the at least one pulse. In response to the internal clock signal, an SP memory accesses at least one SP memory cell at the address provided by the input port storage element. Because the next input datum is selected by the input port selector at the first time during the one of the at least one pulse not after the one of the at least one pulse, by the time the selected address is allowed to be passed through the input port storage element, the selected address has already been updated. Therefore, a duration between the one of the at least one pulse and a next pulse can be shortened because the duration does not need to cover the delay for updating to the next input datum. Hence the overlapped TDM DP memory is more time efficient and can operate at a higher speed.

In some embodiments, a circuit includes a single-port (SP) memory, a time division multiplexing (TDM) circuit, an address selector and an address storage element. The TDM circuit is configured to receive an external clock signal and generate an internal clock signal that has at least one pulse during a clock cycle of the external clock signal. The input port selector is configured to select a current input datum before a first time within one of the at least one pulse, and select a next input datum starting from the first time to generate a selected input datum. The input port storage element is configured to receive the selected datum from the input port selector and provide a datum passed through or stored in the input port storage element. The provided datum is the current input datum substantially throughout the one of the at least one pulse. The SP memory is configured to be accessed on the provided datum by the input port storage element in response to the internal clock signal.

In some embodiments, a circuit comprises a single-port (SP) memory, a time division multiplexing (TDM) control circuit, an internal clock generator, an input port selector, and an input port storage element. The TDM control circuit is configured to receive an external clock signal and generate a current pulse control signal which asserts and deasserts in a clock cycle of the external clock signal. The internal clock generator is configured to generate an internal clock signal which has at least one pulse in the clock cycle. One of the at least one pulse is generated in response to the current pulse control signal. The input port selector is configured to select a next input datum in response to the assertion of the current pulse control signal and select a current input datum prior to selecting the next input datum to generate a selected datum. The input port storage element is configured to receive the selected datum from the input port selector and provide a datum passed through or stored in the input port storage element. The provided address is the current input datum substantially throughout the one of the at least one pulse. The SP memory is configured to be accessed based on the provided datum by the input port storage element in response to the internal clock signal.

In some embodiments, in a method, based on an external clock signal, an internal clock signal that has at least one pulse during a clock cycle of the external clock signal is generated. A current input datum is selected before a first time within one of the at least one pulse, and a next input datum is selected starting from the first time. The current input datum is provided substantially throughout the one of the at least one pulse. The single-port (SP) memory is accessed using the current input datum in response to the internal clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a single-port (SP) memory;
   a time division multiplexing (TDM) circuit configured to receive an external clock signal and generate an internal clock signal that has at least one pulse during a clock cycle of the external clock signal;
   an input port selector configured to select a current input datum before a first time within one of the at least one pulse, and select a next input datum starting from the first time to generate a selected datum;
   a first input port storage element configured to receive the selected datum from the input port selector and provide a provided datum passed through or stored in the first input port storage element,
   wherein the provided datum is the current input datum substantially throughout the one of the at least one pulse; and
   the single-port (SP) memory is configured to be accessed based on the provided datum by the first input port storage element in response to the internal clock signal.

2. The circuit of claim 1, wherein the at least one pulse comprises a first pulse and a second pulse;
   the one of the at least one pulse is the first pulse;
   the time division multiplexing (TDM) circuit comprises:
      a time division multiplexing (TDM) control circuit configured to receive the external clock signal and generate a first pulse control signal which asserts and deasserts during the clock cycle, and a second pulse control signal which asserts after the first pulse control signal deasserts, and deasserts before completion of the clock cycle; and
      an internal clock generator configured to generate the first pulse in response to the first pulse control signal, and the second pulse in response to the second pulse control signal.

3. The circuit of claim 2, wherein the input port selector selects the current input datum before the first time within the first pulse and selects the next input datum starting from the first time in response to the assertion of the first pulse control signal.

4. The circuit of claim 3, wherein the input port selector selects a post-next input datum starting from a second time within the second pulse in response to the assertion of the second pulse control signal.

5. The circuit of claim 3, wherein the input port selector selects a post-next input datum after the second pulse in response to the deassertion of the second pulse control signal.

6. The circuit of claim 1, wherein the at least one pulse comprises a second pulse but free of a first pulse;
   the one of the at least one pulse is the second pulse;
   the time division multiplexing (TDM) circuit comprises:
      a time division multiplexing (TDM) control circuit configured to receive the external clock signal and generate a first first pulse control signal which is free of an assertion and a deassertion during the clock cycle when the clock cycle is free of a previous input datum prior to the current input datum, a second first pulse control signal which asserts and deasserts during the clock cycle regardless whether the clock cycle has the previous input datum, and a second pulse control signal which asserts after the second first pulse control signal deasserts, and deasserts before completion of the clock cycle; and
      an internal clock generator configured to generate the internal clock signal free of the first pulse in response to the first first pulse control signal, and generate the internal clock signal having the second pulse in response to the second pulse control signal.

7. The circuit of claim 6, wherein the input port selector selects the current input datum before the first time within the second pulse and selects the next input datum from the first time in response to the assertion of the second pulse control signal.

8. A circuit, comprising:
   a single-port (SP) memory;
   a time division multiplexing (TDM) control circuit configured to receive an external clock signal and generate a current pulse control signal which asserts and deasserts in a clock cycle of the external clock signal;
   an internal clock generator configured to generate an internal clock signal which has at least one pulse in the clock cycle,
      one of the at least one pulse being generated in response to the current pulse control signal;
   an input port selector configured to select a next input datum in response to the assertion of the current pulse control signal and select a current input datum prior to selecting the next input datum to generate a selected datum;
   an input port storage element configured to receive the selected datum from the input port selector and provide a provided datum passed through or stored in the input port storage element,
      wherein the provided datum is the current input datum substantially throughout the one of the at least one pulse; and
      the single-port (SP) memory is configured to be accessed based on the provided datum by the input port storage element in response to the internal clock signal.

9. The circuit of claim 8, wherein the at least one pulse comprises a first pulse and a second pulse;
   the one of the at least one pulse is the first pulse;
   the time division multiplexing (TDM) control circuit is further configured to generate a next pulse control signal which asserts after the current pulse control signal deasserts, and deasserts before completion of the clock cycle;
   the internal clock generator is further configured to generate the second pulse in response to the next pulse control signal.

10. The circuit of claim 9, wherein the input port selector selects the current input datum before a first time within the first pulse and selects the next input datum starting from the first time in response to the assertion of the current pulse control signal.

11. The circuit of claim 10, wherein the input port selector selects a post-next input datum starting a second time within the second pulse in response to the assertion of the next pulse control signal.

12. The circuit of claim 10, wherein the input port selector selects a post-next input datum after the second pulse in response to the deassertion of the current pulse control signal.

13. The circuit of claim 8, wherein the at least one pulse comprises a second pulse but free of a first pulse;
- the one of the at least one pulse is the second pulse;
- the time division multiplexing (TDM) control circuit is further configured to generate a first previous control signal which is free of an assertion and a deassertion during the clock cycle when the clock cycle is free of a previous input datum prior to the current input datum, a second previous control signal which asserts and deasserts during the clock cycle regardless whether the clock cycle has the previous input datum, the current pulse control signal asserts after the second previous control signal deasserts, and deasserts before completion of the clock cycle; and
- the internal clock generator is further configured to generate the internal clock signal free of the first pulse in response to the first previous control signal, and generate the internal clock signal having the second pulse in response to the current pulse control signal.

14. The circuit of claim 13, wherein the input port selector selects the current input datum before a first time within the second pulse, and selects the next input datum starting from the first time in response to the assertion of the current pulse control signal.

\* \* \* \* \*